US012690492B2

(12) United States Patent
Ting et al.

(10) Patent No.: US 12,690,492 B2
(45) Date of Patent: Jul. 21, 2026

(54) INTEGRATED CIRCUIT PACKAGE WITH IMPROVED HEAT DISSIPATION EFFICIENCY AND METHODS OF FORMING THE SAME

(71) Applicant: Taiwan Semiconductor Manufacturing Co., Ltd., Hsinchu (TW)

(72) Inventors: Kuo-Chiang Ting, Hsinchu (TW); Sung-Feng Yeh, Taipei City (TW); Ta Hao Sung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 651 days.

(21) Appl. No.: 18/152,665

(22) Filed: Jan. 10, 2023

(65) Prior Publication Data
US 2024/0222339 A1 Jul. 4, 2024

Related U.S. Application Data

(60) Provisional application No. 63/436,342, filed on Dec. 30, 2022.

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 70/09* (2026.01);
(Continued)

(58) Field of Classification Search
CPC .............. H01L 25/0657; H01L 25/105; H01L 23/3135; H01L 23/3121;
(Continued)

(56) References Cited

U.S. PATENT DOCUMENTS

2008/0142990 A1* 6/2008 Yu ........................ H10D 84/038
438/109
2012/0032348 A1* 2/2012 Yu ..................... H01L 21/76898
257/E23.141
(Continued)

FOREIGN PATENT DOCUMENTS

CN      113675096 A      11/2021
CN      115527972 A      12/2022
(Continued)

*Primary Examiner* — Didarul A Mazumder
(74) *Attorney, Agent, or Firm* — Slater Matsil, LLP

(57) ABSTRACT

In an embodiment, a device includes a first integrated circuit die, wherein the first integrated circuit die includes a substrate formed of a semiconductor material and a conductive via penetrating through the substrate; a second integrated circuit die disposed laterally adjacent to the first integrated circuit die; a first gap-filling layer disposed between the first integrated circuit die and the second integrated circuit die, wherein the first gap-filling layer is formed of a material selected from silicon, silicon carbide, silicon oxynitride, silicon nitride, the semiconductor material of the substrate, or a combination thereof; and a third integrated circuit die attached to the first integrated circuit die in a face-to-back manner.

19 Claims, 24 Drawing Sheets

(51) Int. Cl.

| | |
|---|---|
| *H10W 70/09* | (2026.01) |
| *H10W 70/60* | (2026.01) |
| *H10W 70/652* | (2026.01) |
| *H10W 72/00* | (2026.01) |
| *H10W 72/20* | (2026.01) |
| *H10W 72/90* | (2026.01) |
| *H10W 74/01* | (2026.01) |
| *H10W 74/10* | (2026.01) |
| *H10W 80/00* | (2026.01) |

(52) U.S. Cl.
CPC ..... *H10W 72/0198* (2026.01); *H10W 74/019* (2026.01); *H10W 74/114* (2026.01); *H10W 74/121* (2026.01); *H10W 70/60* (2026.01); *H10W 70/6528* (2026.01); *H10W 72/252* (2026.01); *H10W 72/941* (2026.01); *H10W 72/952* (2026.01); *H10W 80/312* (2026.01); *H10W 80/327* (2026.01); *H10W 90/722* (2026.01); *H10W 90/794* (2026.01)

(58) Field of Classification Search
CPC .. H01L 2225/06541; H01L 2225/1058; H10B 80/00; H10W 80/312; H10W 80/327; H10W 90/794; H10W 90/722; H10W 90/20; H10W 90/00; H10W 74/114; H10W 74/121; H10W 72/20; H10W 72/252; H10W 72/90; H10W 72/941
USPC ........................................................ 257/621
See application file for complete search history.

(56) References Cited

U.S. PATENT DOCUMENTS

| | | | |
|---|---|---|---|
| 2019/0088186 A1* | 3/2019 | Huang | G09G 3/22 |
| 2019/0131276 A1* | 5/2019 | Chen | H01L 23/544 |
| 2019/0131277 A1* | 5/2019 | Yang | H10P 74/273 |
| 2019/0148336 A1* | 5/2019 | Chen | H01L 21/4857 257/774 |
| 2019/0238134 A1* | 8/2019 | Lee | H03K 19/1776 |
| 2020/0235073 A1 | 7/2020 | Chen et al. | |
| 2022/0190039 A1* | 6/2022 | Sun | H10K 59/879 |
| 2022/0367373 A1 | 11/2022 | Chen et al. | |

FOREIGN PATENT DOCUMENTS

| | | | |
|---|---|---|---|
| TW | 201810557 A | 3/2018 |
| TW | 202236562 A | 9/2022 |
| TW | 202245171 A | 11/2022 |

\* cited by examiner

INTEGRATED CIRCUIT PACKAGE WITH IMPROVED HEAT DISSIPATION EFFICIENCY AND METHODS OF FORMING THE SAME

PRIORITY CLAIM AND CROSS-REFERENCE

This application claims the benefit of U.S. Provisional Application No. 63/436,342, filed on Dec. 30, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
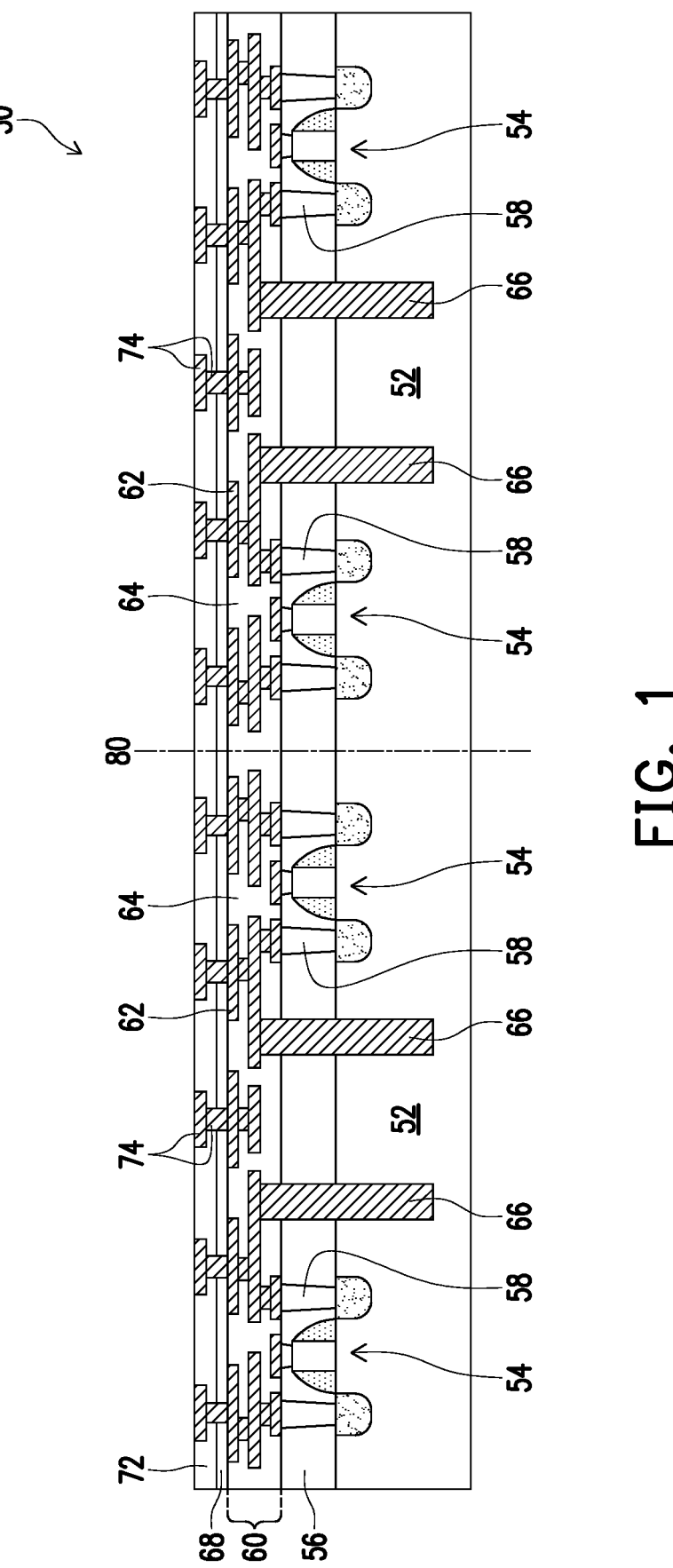
FIG. 1 is a cross-sectional view of a wafer including a plurality of integrated circuit dies.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an integrated circuit package including a gap-filling layer formed in a gap between integrated circuit dies is provided. The gap-filling layer may include a material having a high thermal conductivity and a low mismatch of the thermal expansion coefficient with an adjacent integrated circuit die. As such, heat generated by the integrated circuit dies may be effectively dissipated to other components through the gap-filling layer. Reliability and performance of the integrated circuit packages may thus be improved.

FIG. 1 illustrates a cross-sectional view of a wafer 30 including a plurality of integrated circuit dies 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, wide input/output (WIO) memory, NAND flash, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The wafer 30 may be processed according to applicable manufacturing processes to form integrated circuits in the integrated circuit dies 50. For example, each of the integrated circuit dies 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back-side.

Devices 54 (represented by a transistor) may be formed at the front surface of the semiconductor substrate 52. The devices 54 may be active devices (e.g., transistors, diodes, etc.), capacitors, resistors, etc. For example, the devices 54 may be transistors that include gate structures and source/ drain regions, where the gate structures are on channel regions, and the source/drain regions are adjacent to the channel regions. The channel regions may be patterned regions of the semiconductor substrate 52. For example, the channel regions may be regions of semiconductor fins, semiconductor nanosheets, semiconductor nanowires, or the like patterned in the semiconductor substrate 52. When the devices 54 are transistors, they may be nanostructure field-effect transistors (Nanostructure-FETs), fin field-effect transistors (FinFETs), planar transistors, or the like. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Figure 7:
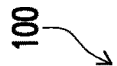

Contacts 58 extend through the ILD 56 to electrically and physically couple the devices 54. For example, when the devices 54 are transistors, the contacts 58 may couple the gates and source/drain regions of the transistors to other circuit components. The contacts 58 may be formed of tungsten, cobalt, nickel, copper, silver, gold, aluminum, the like, or combinations thereof. An interconnect structure 60 is over the ILD 56 and contacts 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers, which may be formed in the low-k dielectric layers by a damascene process, such as a single damascene process, a dual dama-scene process, or the like. The metallization patterns may be formed of a suitable conductive material, such as copper, tungsten, aluminum, silver, gold, a combination thereof, or the like. The metallization patterns of the interconnect structure 60 are electrically coupled to the devices 54 by the contacts 58. In some embodiments, passive devices are also formed in the interconnect structure 60. FIG. 7 also illus-trates pads 62, such as aluminum pads, to which external connections are made. The pads 62 are on the active side of the integrated circuit dies 50, such as in and/or on the interconnect structure 60. One or more passivation films 64 are on the integrated circuit dies 50, such as on portions of the interconnect structure 60 and pads 62. Openings extend through the passivation films 64 to the pads 62.

The conductive vias 66 extend into the interconnect structure 60 and/or the semiconductor substrate 52. The conductive vias 66 are electrically coupled to the pads 62 and/or the metallization patterns of the interconnect struc-ture 60. The conductive vias 66 may be through-substrate vias, such as through-silicon vias. As an example to form the conductive vias 66, recesses can be formed in the intercon-nect structure 60 and/or the semiconductor substrate 52 by, for example, etching, milling, laser techniques, a combina-tion thereof, or the like. A thin barrier layer may be confor-mally deposited in the recesses, such as by CVD, atomic layer deposition (ALD), physical vapor deposition (PVD), a combination thereof, or the like. The barrier layer may include titanium, titanium nitride, tantalum, tantalum nitride, combinations thereof, or the like. A conductive material may be deposited over the barrier layer and in the recesses. The conductive material may be formed by elec-troplating, electroless plating, CVD, ALD, PVD, a combi-nation thereof, or the like. Examples of the conductive material include copper, silver, gold, tungsten, cobalt, alu-minum, nickel, alloy thereof, a combination thereof, or the like. In some embodiments, the conductive material is copper. Excess conductive material and barrier layer are removed by, for example, a chemical-mechanical polish (CMP). The remaining portions of the barrier layer and conductive material in the recesses form the conductive vias 66.

In this embodiment, the conductive vias 66 are formed by a via-middle process, such that the conductive vias 66 extend through a portion of the interconnect structure 60 and extend into the semiconductor substrate 52. The conductive vias 66 formed by the via-middle process are connected to a middle metallization pattern of the interconnect structure 60. In another embodiment, the conductive vias 66 are formed by a via-first process, such that the conductive vias 66 extend into the semiconductor substrate 52 but not the interconnect structure 60. The conductive vias 66 formed by a via-first process are connected to a lower metallization pattern of the interconnect structure 60. In yet another embodiment, the conductive vias 66 are formed by a via-last process, such that the conductive vias 66 extend through an entirety of the interconnect structure 60 and extend into the semiconductor substrate 52. The conductive vias 66 formed by the via-last process are connected to the upper metalli-zation pattern of the interconnect structure 60.

One or more passivation layer(s) 68 are disposed on the interconnect structure 60. The passivation layer(s) 68 may be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzo-cyclobutene (BCB) based polymer, molding compound, the like, or a combination thereof. The passivation layer(s) 68 may be formed by chemical vapor deposition (CVD), spin coating, lamination, the like, or a combination thereof. In some embodiments, the passivation layer(s) 68 include a silicon oxynitride layer or a silicon nitride layer.

A dielectric layer 72 is disposed on the passivation layer(s) 68. The dielectric layer 72 may be formed of an oxide such as silicon oxide, phosphosilicate glass (PSG), borosilicate glass (BSG), or boron-doped phosphosilicate glass (BPSG); a nitride such as silicon nitride or silicon oxynitride; combinations thereof; or the like. The dielectric layer 72 may be formed, for example, by CVD, spin coating, lamination, or the like. In some embodiments, the dielectric layer 72 is formed of silicon oxide.

Die connectors 74 extend through the dielectric layer 72 and the passivation layer(s) 68. The die connectors 74 may include conductive pillars, pads, or the like, to which exter-nal connections can be made. In some embodiments, the die connectors 74 include bond pads at the front-side surface of the integrated circuit die 50, and include post-pad vias that connect the bond pads to the interconnect structure 60. In such embodiments, the die connectors 74 (including the bond pads and the post-pad vias) may be formed by a damascene process, such as a single damascene process, a dual damascene process, or the like. The die connectors 74 can be formed of a conductive material, such as a metal, such as copper or its alloy, or the like, which can be formed by, for example, electroplating, electroless plating, CVD. PVD, or the like. In some embodiments, after the die connectors 74 and the dielectric layer 72 are formed, the wafer 30 may be singulated according to the scribe line 80, so that the integrated circuit dies 50 may be separated and can be picked up individually.

FIGS. 2-12 are cross-sectional views of intermediate stages in the manufacturing of integrated circuit packages 100, in accordance with some embodiments. The integrated circuit packages 100 may be formed by packaging multiple integrated circuit dies 50 in a wafer level and then be singulated, such that each of the integrated circuit packages may include one or more the integrated circuit dies 50. The integrated circuit packages 100 may be system-on-integrated-chips (SoIC) devices, although other types of packages may be formed.

Figure 2:
FIGS. 2 to 14 are cross-sectional views of intermediate stages in the manufacturing of an integrated circuit package, in accordance with some embodiments.
Figure 2:
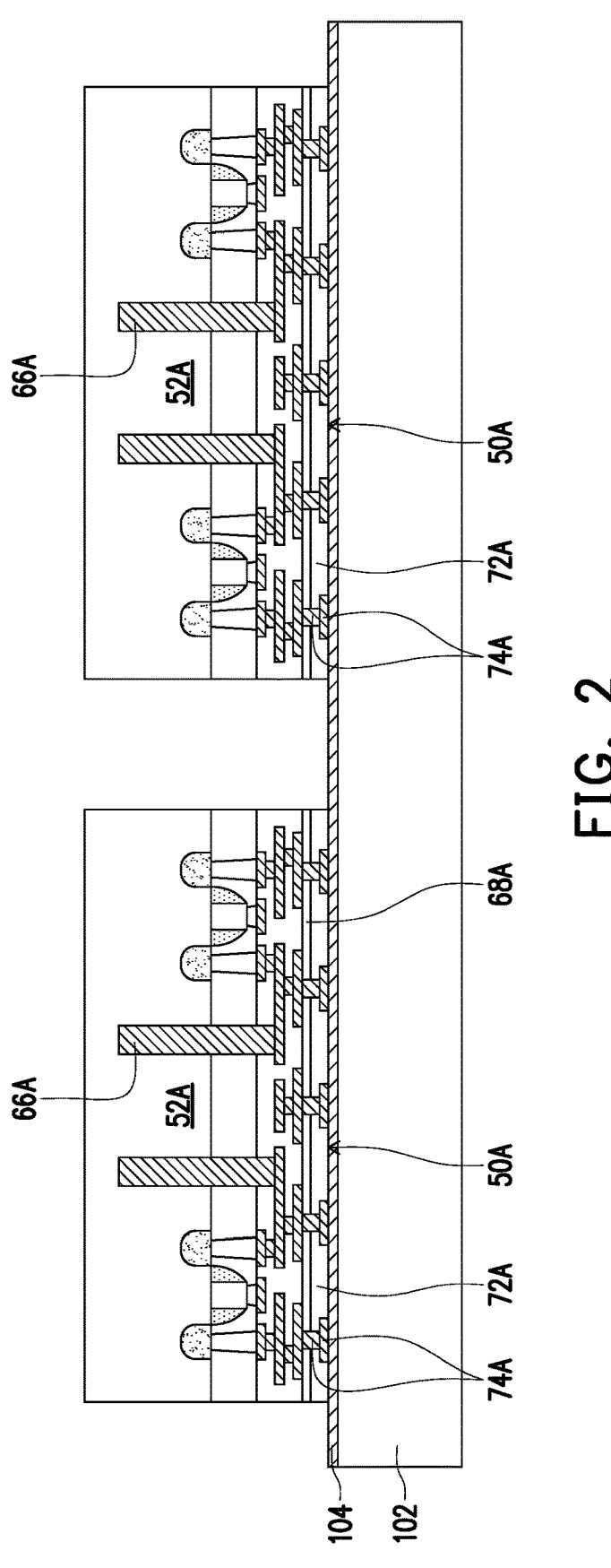

In FIG. 2, a carrier substrate 102 is provided. The carrier substrate 102 may be a glass carrier substrate, a ceramic carrier substrate, or the like. The carrier substrate 102 may be a wafer, such that multiple packages can be formed on the carrier substrate 102 simultaneously. Integrated circuit dies 50A are attached to the carrier substrate 102, in accordance with some embodiments. The integrated circuit dies 50A may be the integrated circuit die 50 as described for FIG. 1. Similar features in the integrated circuit die 50A are not separately illustrated or illustrated with the same referencing numeral and with an end of "A." The integrated circuit dies 50A may be attached to the carrier substrate 102 in a face-down manner, such that the front-sides of the integrated circuit dies 50A are attached to the carrier substrate 102. The integrated circuit dies 50A may be placed by, e.g., a pick-and-place process.

The integrated circuit dies 50A may be attached to the carrier substrate 102 by bonding the integrated circuit dies 50A to the carrier substrate 102 with a release layer 104. The release layer 104 is on a surface of the carrier substrate 102. In some embodiments, the release layer 104 is a thermal-release material, which loses its adhesive property when heated, such as a light-to-heat-conversion (LTHC) release coating; an ultra-violet (UV) glue, which loses its adhesive property when exposed to UV lights; or the like. The release layer 104 may be dispensed as a liquid and cured, may be a laminate film laminated onto the carrier substrate 102 before the attachment of the integrated circuit dies 50A.

Figure 3:
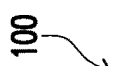

In FIG. 3, a gap-filling layer 106 is formed between the integrated circuit dies 50A. Initially, the gap-filling layer 106 may bury or cover the integrated circuit dies 50A, such that the top surface of the gap-filling layer 106 is above the back-side surfaces of the integrated circuit dies 50A. The gap-filling layer 106 is disposed over the portions of the carrier substrate 102 between the integrated circuit dies 50A, and contacts the top surface of the release layer 104 (if present) or the carrier substrate 102. The gap-filling layer 106 fills (and may overfill) the gaps between the integrated circuit dies 50A.

The gap-filling layer 106 may be formed of a material that has a high thermal conductivity (e.g., higher than 2 W/m·K) and low coefficient of thermal expansion (CTE) mismatch (e.g., less than 1.3 μm/(m·K)) with the material of the semiconductor substrate 52A of the integrated circuit dies 50A. In some embodiments, the gap-filling layer 106 is silicon. In some embodiments, the gap-filling layer 106 is silicon carbide, silicon oxynitride, silicon nitride, a combination thereof, or the like. In some embodiments, the gap-filling layer 106 is a semiconductor material similar to the material of the semiconductor substrate 52A of the integrated circuit dies 50A, though they may have different crystalline structures. For example, the gap-filling layer 106 is formed of silicon such as amorphous silicon or polycrystalline silicon, and the semiconductor substrate 52A is formed of silicon such as single crystalline silicon, in accordance with some embodiments. The gap-filling layer 106 may be formed by CVD, PVD, coating, other suitable deposition methods, combinations thereof, or the like.

In some embodiments, a liner 108 is formed between the gap-filling layer 106 and the integrated circuit dies 50A, and over the release layer 104 (if present) or the carrier substrate 102. For example, the liner 108 is formed around the integrated circuit dies 50A, and the gap-filling layer 106 is formed on the liner 108. Acceptable material of the liner 108 may include a nitride such as silicon nitride, silicon carbonitride, silicon oxynitride, silicon oxycarbonitride, or the like, which may be formed by a suitable deposition method such as CVD, PVD, ALD, combinations thereof, or the like. The liner 108 may help stop cracking (if this is a concern) in the gap-filling layer 106 propagating to the integrated circuit dies 50A.

Figure 4:
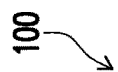

In FIG. 4, a removal process is performed to level surfaces of the gap-filling layer 106 and the liner 108 with the back-side surfaces of the integrated circuit dies 50A (e.g., the back-side surfaces of the semiconductor substrates 52A). In some embodiments, the removal process may be a chemical mechanical polish (CMP), grinding, an etch-back process, combinations thereof, or the like. After the removal process, excess portions of the gap-filling layer 106 and liner 108 over the back-side surfaces of the integrated circuit dies 50A are removed. In some embodiments, the removal process also includes removing a portion of the semiconductor substrates 52A of the integrated circuit dies 50A, though the conductive vias 66A may remain buried by the semiconductor substrates 52A after the removal process.

Figure 5:
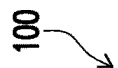

In FIG. 5, the semiconductor substrates 52A are recessed to expose the conductive vias 66A, in accordance with some embodiments. Portions of the gap-filling layer 106 and portions of the liner 108 may also be removed by the recessing process. The recessing process may be, for example, an etch-back process, or the like, which is performed at the back-sides of the integrated circuit dies 50A. In some embodiments, the recessing process may be a combination of the etch-back process with CMP or a grinding process, such as performing the etch-back process to expose sidewalls of the conductive vias 66A after performing the CMP or the grinding process to expose the top of the conductive via 66A.

Figure 6:
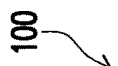

In FIG. 6, a bonding film 112 is formed around the conductive vias 66A of each integrated circuit die 50A and over the gap-filling layer 106 and the liner 108. For example, the bonding film 112 may bury or cover the conductive vias 66A. The bonding film 112 can help electrically isolate the conductive vias 66A from one another, thus avoiding shorting, and can also be utilized in a subsequent bonding process. The bonding film 112 may be a single layer or a composite layer including a plurality of sub-layers. The single layer or the sub-layers of the bonding film 112 may include an oxide such as silicon oxide, phosphosilicate glass (PSG), borosilicate glass (BSG), or boron-doped phosphosilicate glass (BPSG); an oxynitride such as silicon oxynitride; combinations thereof; or the like. The bonding film 112 may be formed by a suitable deposition process such as CVD, PVD, coating, other suitable deposition methods, combinations thereof, or the like. In some embodiments, the as-deposited bonding film 112 includes protrusions (not shown) over the conductive vias 66A, and a planarization process, such as CMP, grinding, or an etch-back process, may be optionally performed to remove protrusions of the bonding film 112 for facilitating the subsequent processes for forming bonding pads 114 (e.g., see FIG. 7). The remaining portions of the bonding film 112 in the recess laterally surround a portion of the sidewalls of the conductive vias 66A. The bonding film 112 may continuously extend over the gap-filling layer 106 and the liner 108. In some embodiments, the bonding film 112 has a thickness of 0.02 um to 2 um.

In FIG. 7, bonding pads 114 are formed over respective conductive vias 66A, in accordance with some embodiments. The bonding pads 114 may include a material similar to the conductive vias 66A. In some embodiments, the bonding pads 114 include a multi-layer structure, such as including a main layer and a barrier layer surrounding a bottom and sidewalls of the main layer. The main layer may include copper or other low-resistance material such as copper, a copper alloy, silver, gold, tungsten, cobalt, aluminum, nickel, a combination thereof, or the like, and the barrier layer may include titanium, titanium nitride, tantalum, tantalum nitride, combinations thereof, or the like. The formation of the bonding pads 114 may include etching the bonding film 112 for forming openings for the bonding pads 114, which expose the conductive vias 66A. Materials of the bonding pads 114 may then be deposited in the openings and over the bonding film 112, such as by electroplating, electroless plating, CVD, ALD, PVD, combinations thereof, or the like. Excess material of the bonding pads 114 over the bonding film 112 may be removed by a planarization process, such as CMP or grinding. In some embodiments, the bonding pads 114 have a size greater than the size of conductive vias 66A in a plan view, which may facilitate the subsequent attachment of the integrated circuit dies 50B (e.g., see FIG. 8). For example, a length and/or a width of the bonding pads 114 may be greater than a height of the bonding pads 114.

Figure 8:
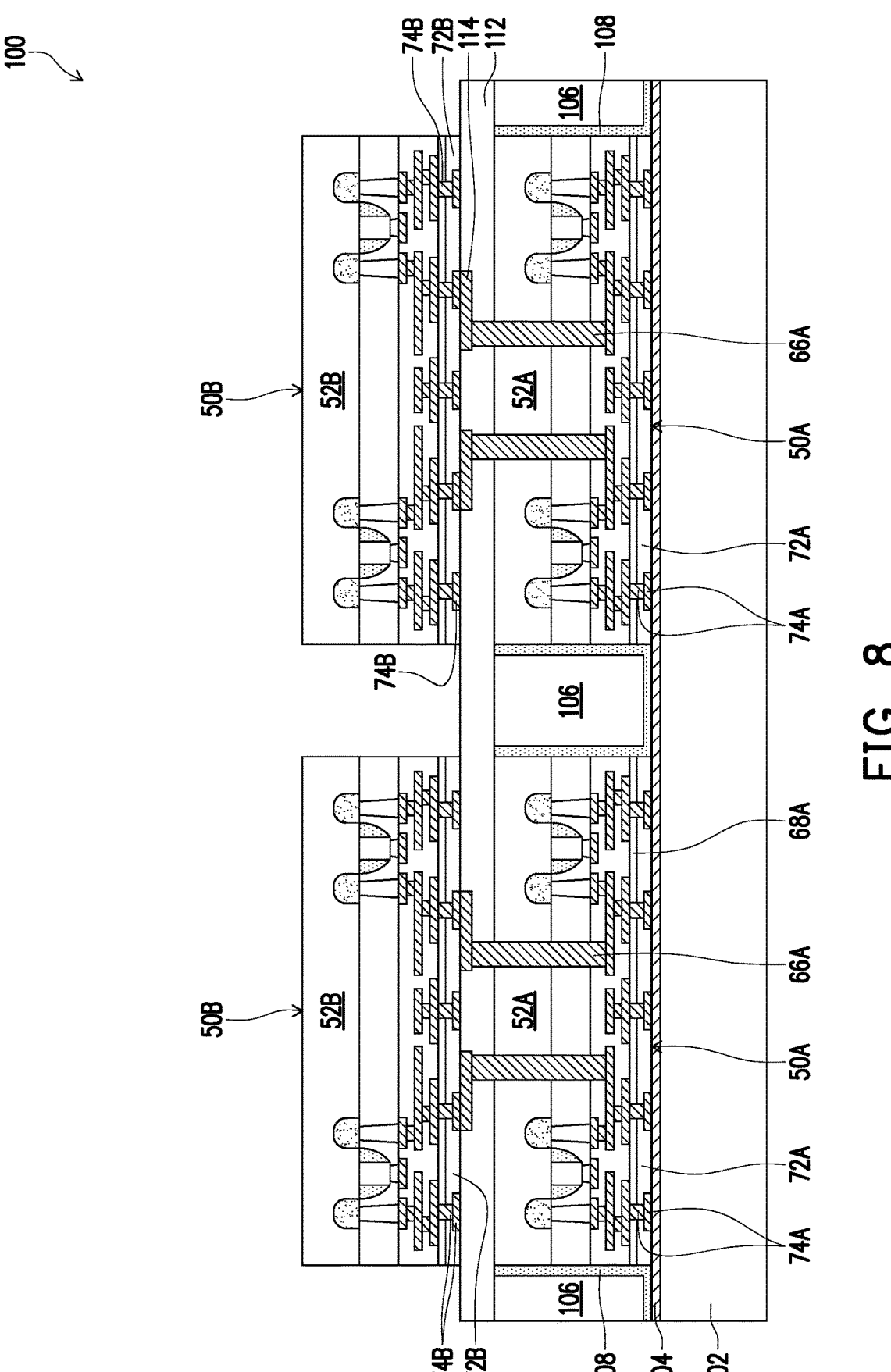

In FIG. 8, integrated circuit dies 50B are attached to the integrated circuit dies 50A, in accordance with some embodiments. The integrated circuit dies 50B may be the integrated circuit die 50 as described for FIG. 1. Similar features in the integrated circuit die 50B are not separately illustrated or are illustrated with the same referencing numeral and with an end of "B." In some embodiments, the integrated circuit dies 50B have a different function from the integrated circuit dies 50A. As an example, the integrated circuit dies 50A are logic dies, and the integrated circuit dies 50B are memory dies. The integrated circuit dies 50A may be attached to the bonding film 112 in a face-to-back manner, such that the front-sides of the integrated circuit dies 50B are attached to the back-sides of the integrated circuit dies 50A. The integrated circuit dies 50B may be placed by, e.g., a pick-and-place process.

The integrated circuit dies 50B may be bonded to the bonding film 112 by direct bonding. The dielectric layers 72B of the integrated circuit dies 50B are directly bonded to the bonding film 112 through dielectric-to-dielectric bonding, preferably without using any adhesive material. The die connectors 74B of the integrated circuit dies 50B are directly bonded to respective bonding pads 114 over the conductive vias 66A of the integrated circuit dies 50A through metal-to-metal bonding, preferably without using any eutectic material (e.g., solder). The bonding may include a pre-bonding and an annealing. During the pre-bonding, a small pressing force is applied to press the integrated circuit dies 50B against the integrated circuit dies 50A. The pre-bonding is performed at a low temperature, such as a temperature in the range of 15° C. to 30° C. The bonding strength is then improved in a subsequent annealing step, in which the bonding film 112, the bonding pads 114, the dielectric layers 72B, and the die connectors 74B are annealed. After the annealing, direct bonds such as fusion bonds are formed, bonding the dielectric layers 72B to the bonding film 112. For example, the bonds can be covalent bonds between the material of the dielectric layer 72B and the material of the bonding film 112. The bonding pads 114 disposed over the conductive vias 66A are connected to the die connectors 74B with a one-to-one correspondence. The conductive vias 66A and the die connectors 74B may be in physical contact after the pre-bonding, or may expand to be brought into physical contact during the annealing. Further, during the annealing, the material of bonding pads 114 (e.g., copper) and the material of die connectors 74B (e.g., copper) are intermingled, so that metal-to-metal bonds are also formed. Hence, the resulting bonds between the integrated circuit dies 50B and the integrated circuit dies 50A include both dielectric-to-dielectric bonds (e.g., dielectric layers 72A to bonding film 112) and metal-to-metal bonds (die connectors 74B to bonding pads 114). Respective ones of the bonded integrated circuit dies 50A and 50B are thus electrically coupled.

In some embodiments, the integrated circuit dies 50B do not include conductive vias 66 (previously described for FIG. 1). As a result, the integrated circuit packages 100 include two layers of integrated circuit dies (e.g., 50A and 50B), and the conductive vias 66 are excluded from the integrated circuit dies 50B because the integrated circuit dies 50B are the upper layer of integrated circuit dies in the integrated circuit package 100. In some embodiments, the integrated circuit package 100 includes more than two layers of integrated circuit dies, and the conductive vias 66 may be formed in each layer of the integrated circuit dies besides the uppermost layer of integrated circuit dies. In yet other embodiments, the uppermost layer could include conductive vias, thus allowing for even greater flexibility in interconnecting the integrated circuit package 100 to other components.

Figure 9:
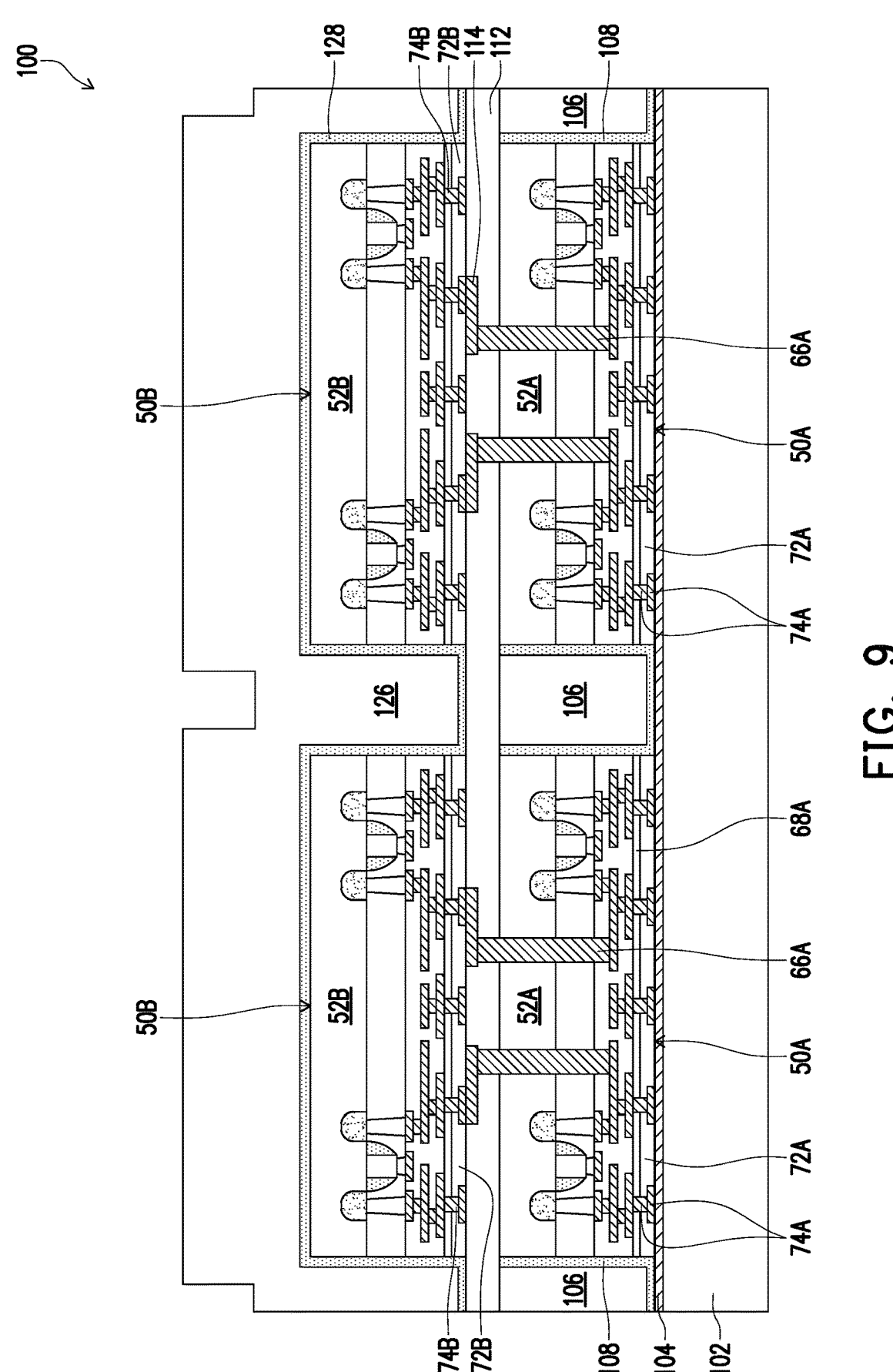

In FIG. 9, a gap-filling layer 126 is formed between the integrated circuit dies 50B, in accordance with some embodiments. Initially, the gap-filling layer 126 may bury or cover the integrated circuit dies 50B, such that the top surface of the gap-filling layer 126 is above the back-side surfaces of the integrated circuit dies 50B. The gap-filling layer 126 is disposed over the gap-filling layer 106 between the integrated circuit dies 50A. The gap-filling layer 126 may be formed of a material that has a high thermal conductivity (e.g., higher than 2 W/m·K) and low CTE mismatch (e.g., less than 1.3 μm/(m·K)) with the material of the semiconductor substrate 52B of the integrated circuit dies 50B. In some embodiments, the gap-filling layer 126 is silicon. In some embodiments, the gap-filling layer 126 is silicon carbide, silicon oxynitride, silicon nitride, a combination thereof, or the like. In some embodiments, the gap-filling layer 126 is formed of a material similar to the material of the semiconductor substrate 52B of the integrated circuit dies 50B, though they may have different crystalline structures. For example, the gap-filling layer 126 is formed of silicon such as amorphous silicon or polycrystalline silicon, and the semiconductor substrate 52B is formed of silicon such as single crystalline silicon, in accordance with some embodiments. In some embodiments, the gap-filling layer 126 is formed of a material similar to the material of the gap-filling layer 106. The gap-filling layer 126 may be formed by CVD, PVD, coating, other suitable deposition methods, combinations thereof, or the like.

In some embodiments, a liner 128 is formed between the gap-filling layer 126 and the integrated circuit dies 50B and between the gap-filling layer 106 and the gap-filling layer 126. Acceptable material of the liner 128 may include nitrides such as silicon nitride, silicon carbonitride, silicon oxynitride, silicon oxycarbonitride, or the like, which may be formed by a suitable deposition process such as CVD, ALD, combinations thereof, or the like. In some embodiments, the liner 128 is formed of a similar dielectric material as the liner 108. The liner 128 is formed around the integrated circuit dies 50B, and the gap-filling layer 126 is formed over the liner 128. The liner 128 may stop cracking (if this is a concern) in the gap-filling layer 126 propagating to the integrated circuit dies 50B.

Figure 10:
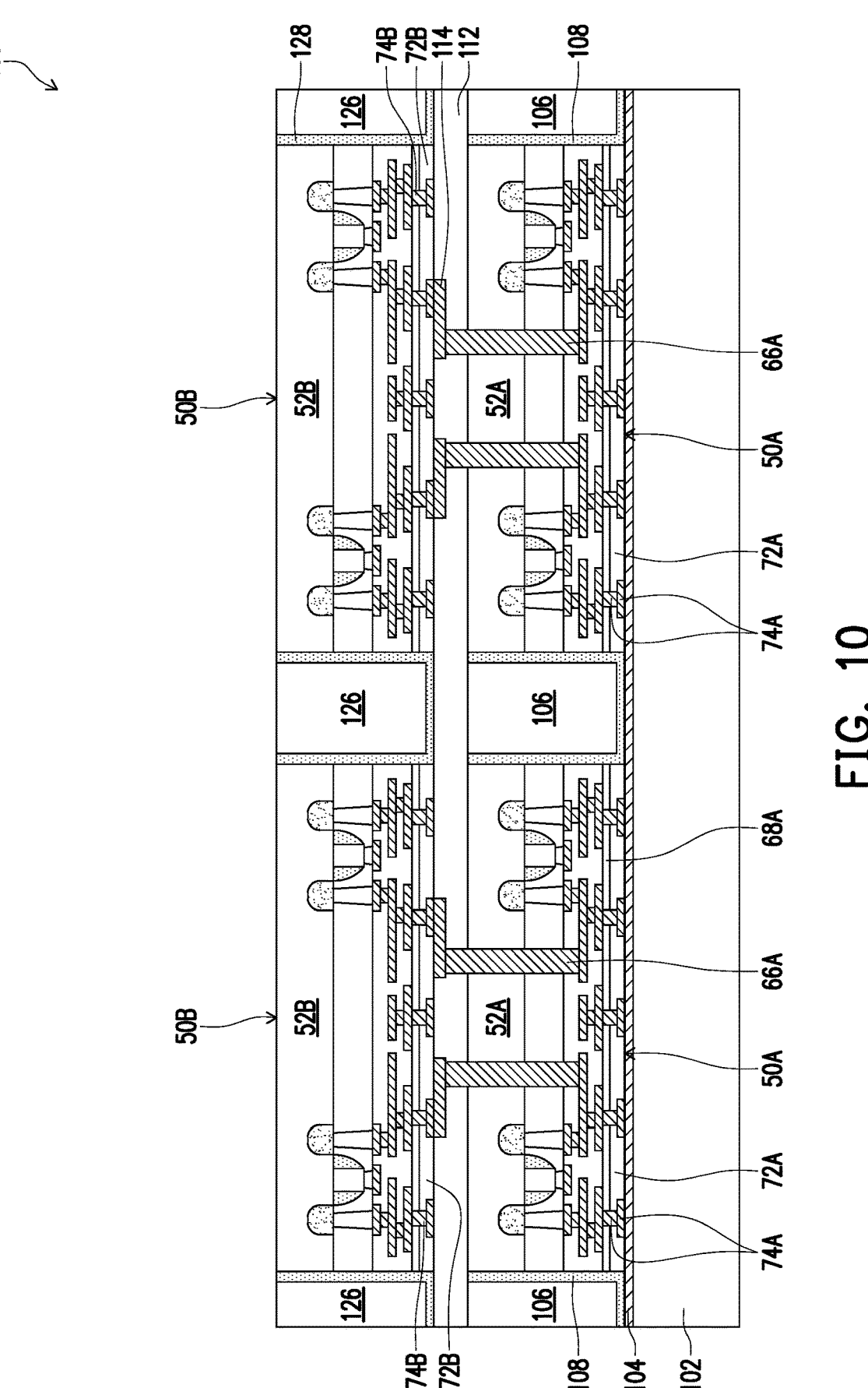

In FIG. 10, a planarization process is performed to level the gap-filling layer 126 with the back-side surfaces of the integrated circuit dies 50B. In some embodiments, the planarization process may include CMP, grinding, an etch-back process, combinations thereof, or the like. After the planarization process, surfaces of the gap-filling layer 126 and the liner 128 and the back-side surfaces of the integrated circuit dies 50B are substantially coplanar (within process variations). In some embodiments, the planarization process also includes removing a portion of the semiconductor substrates 52B.

The liner 108 extends along the sidewall of the integrated circuit dies 50A, and the liner 128 extends along the sidewall of the integrated circuit dies 50B. In embodiments where the outer sidewalls of the integrated circuit dies 50B are aligned with the outer sidewalls of the respective integrated circuit dies 50A, the outer sidewalls of the liner 108 are aligned with the outer sidewalls of the liner 128. More generally, the liners 108 and 128 each includes vertical portions and horizontal portions, with the vertical portions of the liner 108 being aligned with the respective vertical portions of the liner 128.

Figure 11:
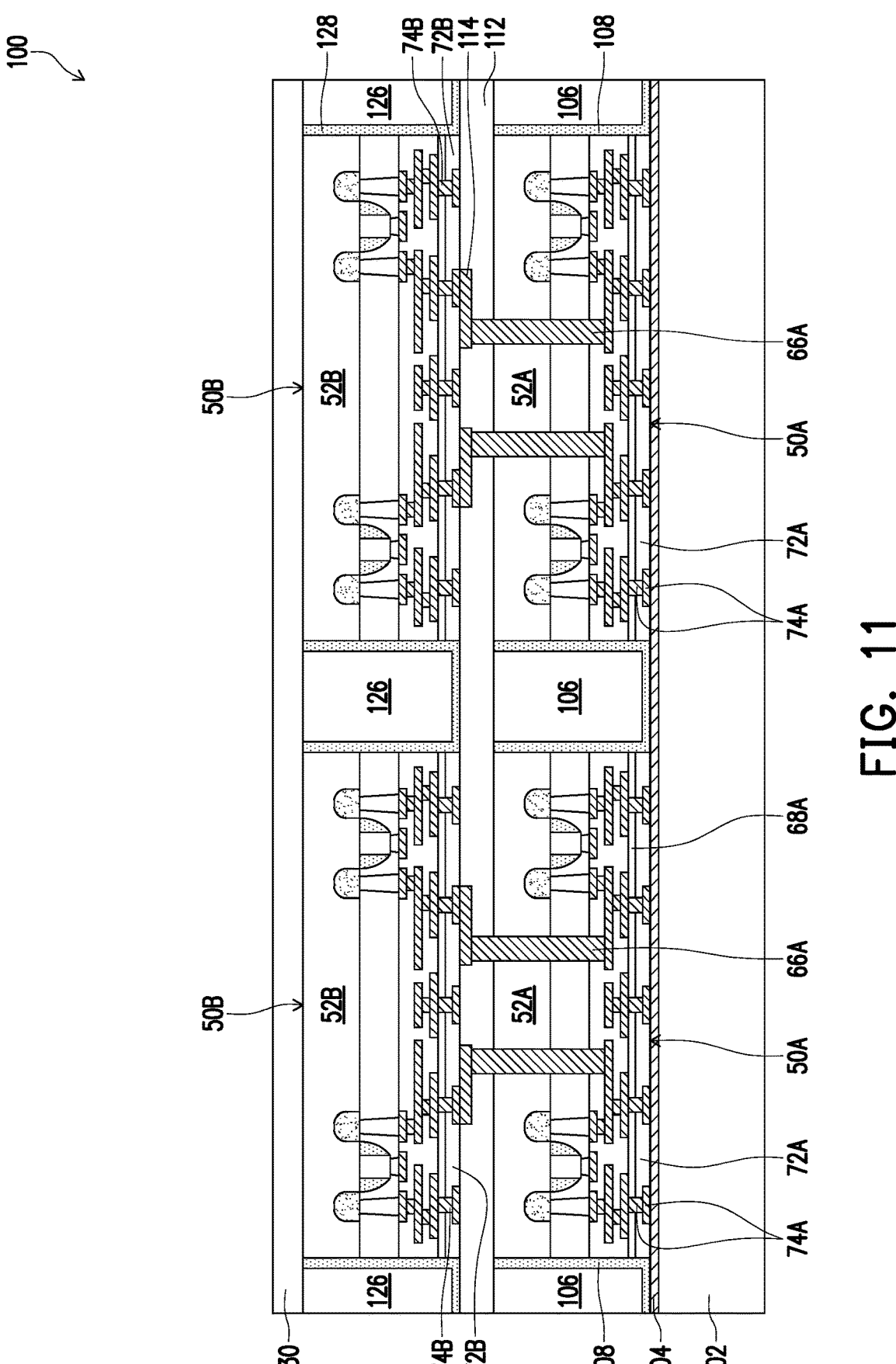

In FIG. 11, a bonding film 130 may be optionally formed over the integrated circuit dies 50B, the liner 128, and the gap-filling layer 126. The bonding film 130 may include a dielectric material. For example, the bonding film 130 may be a single layer or a composite layer including a plurality of sub-layers. The single layer or the sub-layers of the bonding film 130 may include an oxide such as silicon oxide, PSG, BSG, or BPSG; an oxynitride such as silicon oxynitride; an adhesive material such as die attach film (DAF) or thermal interface material (TIM); combinations thereof; or the like. The bonding film 130 may be formed by a suitable deposition process such as CVD, PVD, coating, laminating, combinations thereof, or the like.

Figure 12:
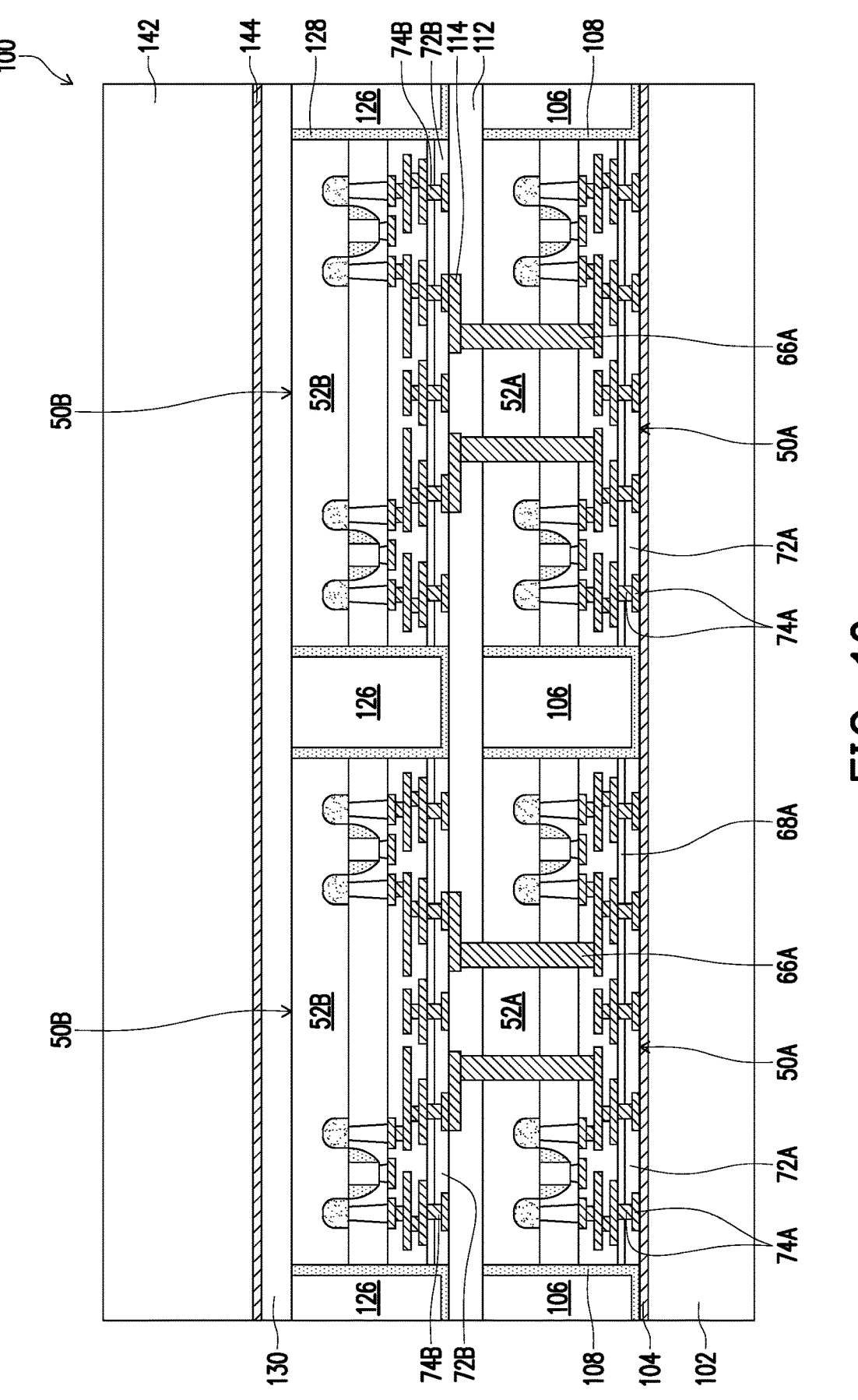

In FIG. 12, a support substrate 142 is attached to the integrated circuit dies 50B, the gap-filling layer 126, and the liner 128. The support substrate 142 may be a blank silicon substrate, in a die form or a wafer form. The support substrate 142 may be attached to the integrated circuit dies 50B, the liner 128, and the gap-filling layer 126 by bonding the support substrate 142 to the integrated circuit dies 50B, the liner 128, and the gap-filling layer 126. For example, the support substrate 142 may be bonded to the bonding film 130 directly or through a bonding film 144. The bonding film 144 may be a film disposed on a surface of the support substrate 142 before being bonded to the bonding film 144. In some embodiments, the bonding film 144 may be a single layer or a composite layer including a plurality of sub-layers. The single layer or the sub-layers of the bonding film 144 may include an oxide such as silicon oxide, PSG, BSG, or BPSG; an oxynitride such as silicon oxynitride; an adhesive material such as die attach film (DAF) or thermal interface material (TIM); combinations thereof, or the like. The bonding film 144 and the bonding film 130 may have a similar material and be formed by a similar manner. In some embodiments, the bonding film 130 and the bonding film 144 may be bonded through dielectric-to-dielectric bonds, such as covalent bonds, or through the adhesive properties of the bonding film 130 and/or 144.

Figure 13:
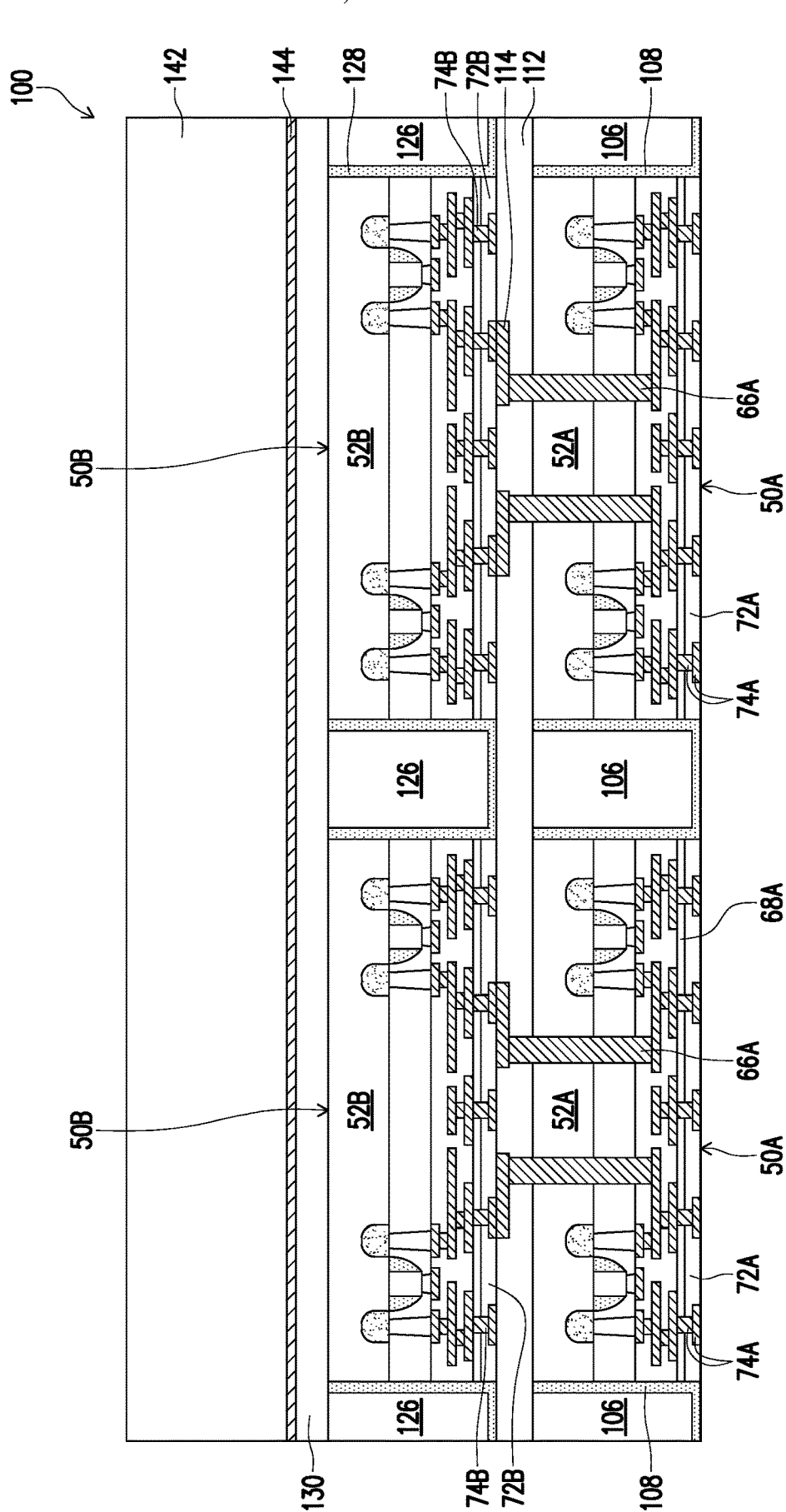

In FIG. 13, a carrier substrate de-bonding is performed to detach (or "de-bond") the carrier substrate 102 from the integrated circuit dies 50A. The de-bonding may include projecting a light such as a laser light or a UV light on the release layer 104 so that the release layer 104 decomposes under the heat of the light and the carrier substrate 102 can be removed. The structure is then flipped over and placed on a tape (not separately illustrated).

Figure 14:
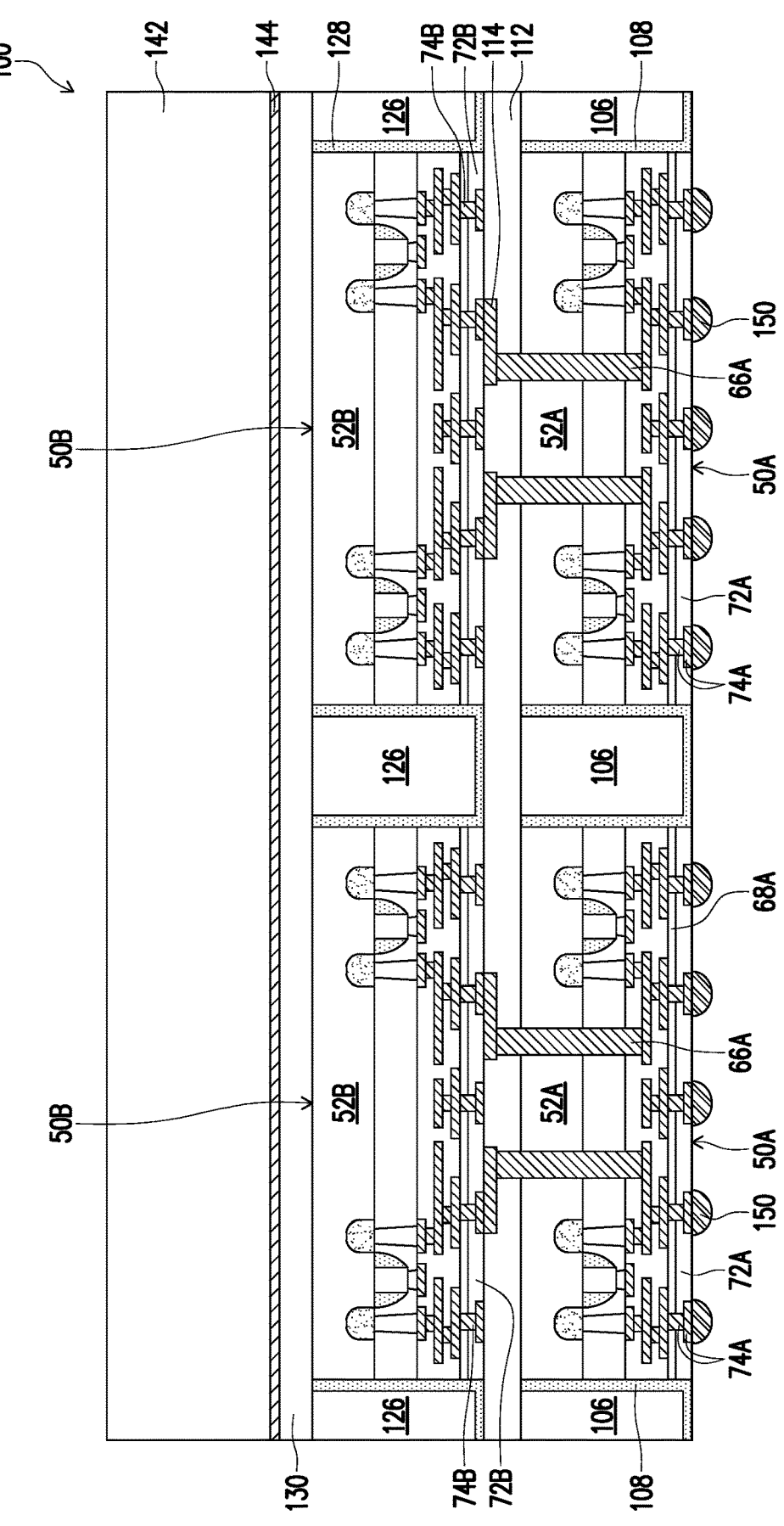

In FIG. 14, conductive connectors 150 are formed on the die connectors 74A. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of a reflowable material (e.g., solder) through evaporation, electroplating, printing, solder transfer, ball placement, or the like. Once a layer of solder has been formed on the structure, a reflow may be performed in order to shape the material into the desired bump shapes. The conductive connectors 150 may be subsequently utilized to connect the integrated circuit package 100 to another component, such as an interposer, a packing substrate, or the like.

In some embodiments, the integrated circuit packages 100 are formed in a wafer level, and a singulation process may be performed to separate the integrated circuit packages 100 as individual packages. For example, the integrated circuit package 100 as illustrated in FIG. 14 may be one of the resulting individual packages. The singulation process may include a mechanical process such as a sawing process, a cutting process, or the like.

In the integrated circuit package 100, the gap-filling layers 106 and 126 may include a material having a high thermal conductivity, so that heat generated by the integrated circuit dies 50A and 50B may be effectively dissipated to other components (e.g., the support substrate 142 or other components adjacent or connected to the integrated circuit package 100) through the gap-filling layers 106 and 126. In addition, the low CTE mismatch between the materials of the gap-filling layers 106 and 126 and the semiconductor substrates 52A and 52B of the integrated circuit dies 50A and 50B, respectively, may help reduce or prevent cracking from occurring in the gap-filling layers 106 and 126. The high thermal conductivity of gap-filling layers 106 and 126 may further help reduce or prevent the cracking resulting from CTE mismatch. For example, the high thermal conductivity of gap-filling layers 106 and 126 can help reduce the temperature of gap-filling layers 106 and 126, since heat can be effectively dissipated and would not be accumulated in the gap-filling layers 106 and 126. Thus, the integrated circuit package 100 may have the capacity for operating high-speed integrated circuit dies with improved performance.

Figure 15:
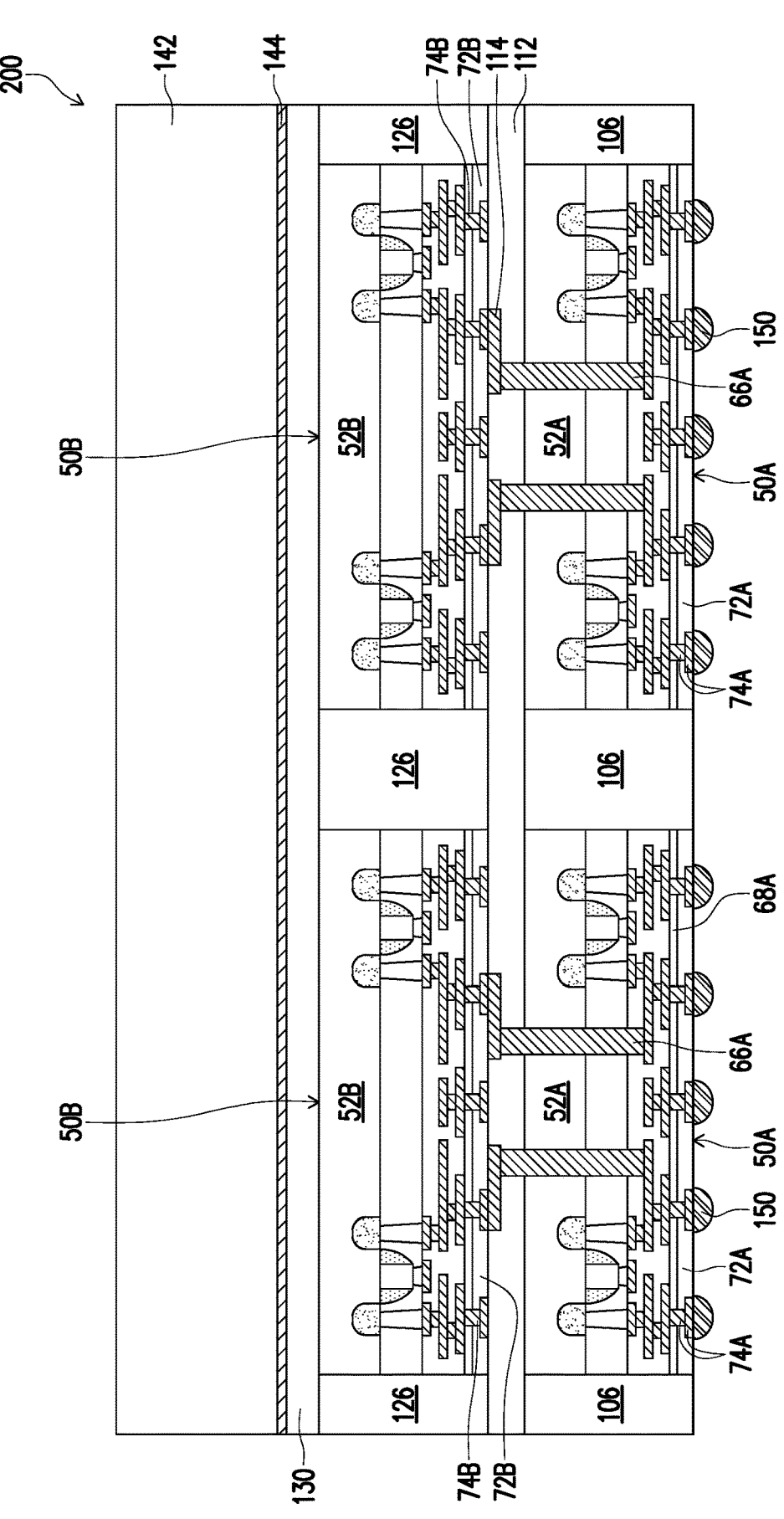
FIG. 15 is a cross-sectional view of an integrated circuit package, in accordance with some embodiments.

Other alternative configurations of the integrated circuit packages with improved heat dissipation efficiency may also be provided. For example, FIG. 15 illustrates a cross-sectional view of an integrated circuit package 200, in accordance with some embodiments. The integrated circuit package 200 may have a structure similar to the integrated circuit package 100 and may be formed using similar processing steps for the integrated circuit package 100, where similar referencing numerals represent similar features. In some embodiments, the gap-filling layer 106 and the gap-filling layer 126 have high thermal conductivity and low CTE mismatch with the semiconductor substrates 52A and 52B and therefore have less or no cracking occurred in the gap-filling layers 106 and 126. Accordingly, the liners 108 and 128, which may help stop cracking in the gap-filling layers 106 and 126 from propagating to the semiconductor substrates 52A and 52B, respectively, may be thus omitted. As such, the gap-filling layer 106 can be in physical contact with the integrated circuit dies 50A, and the gap-filling layer 126 can be in physical contact with the integrated circuit dies 50B, thereby improving the heat dissipation efficiency of the integrated circuit dies 50A and 50B. It is appreciated that although FIG. 15 illustrates both the liner 108 and the liner 128 are omitted, one of liner 108 and the liner 128 may exist in the integrated circuit package 200, in accordance with some embodiments.

Figure 16:
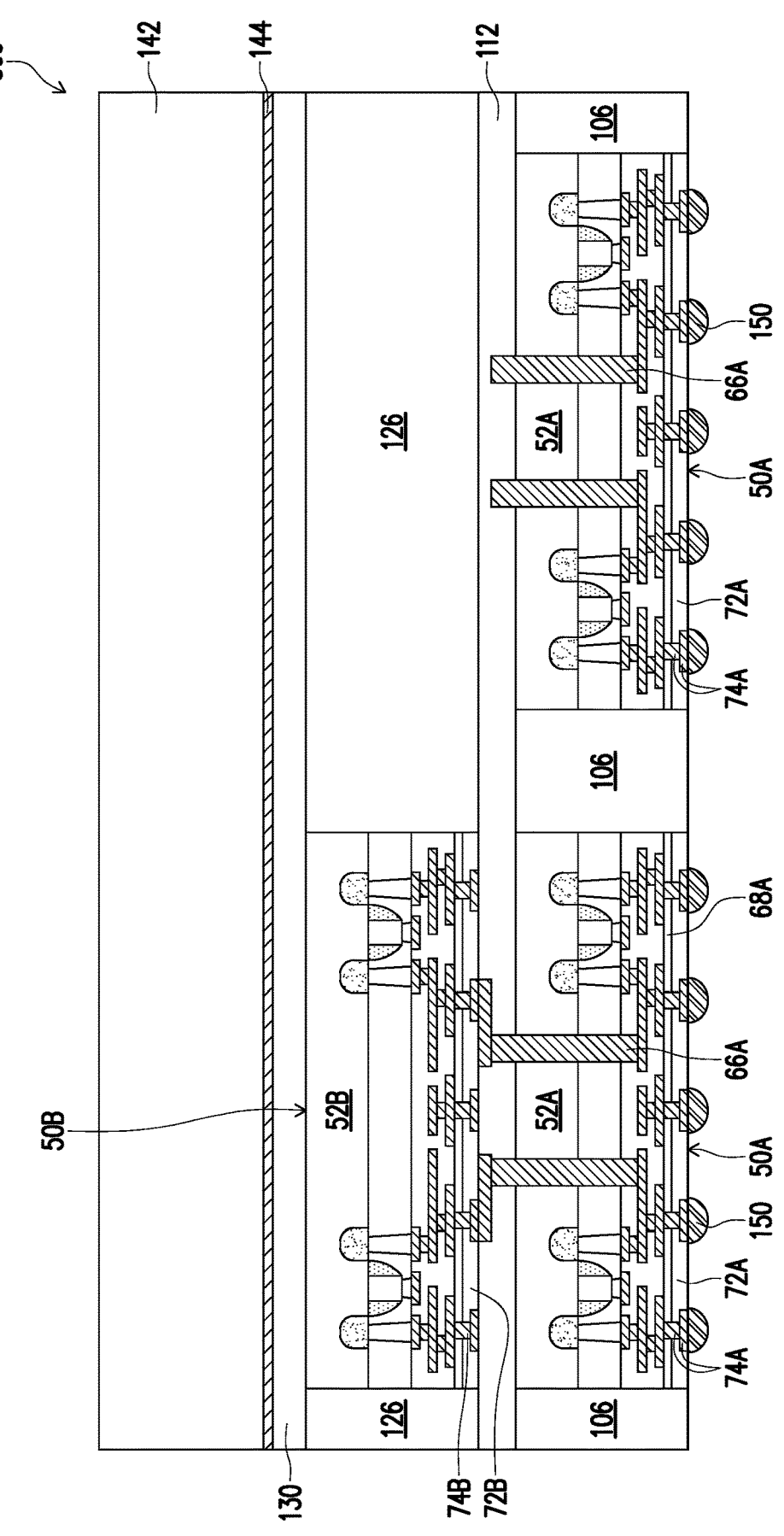
FIG. 16 is a cross-sectional view of an integrated circuit package, in accordance with some embodiments.

FIG. 16 illustrates a cross-sectional view of an integrated circuit package 300, in accordance with some embodiments. The integrated circuit package 300 may have a structure similar to the integrated circuit package 200 and may be formed using similar processing steps for the integrated circuit package 200, where similar referencing numerals represent similar features. In some embodiments in which at least one of the integrated circuit dies 50B is omitted, the location for placing the integrated circuit dies 50B (e.g., the place over at least one of the integrated circuit dies 50A) may be filled the gap-filling layer 126 (e.g., silicon) to avoid forming a huge gap and keep the structure reliability of the integrated circuit package 300. For example, the gap-filling layer 126 may extend over at least one of the integrated circuit dies 50A during the same deposition process of forming the gap-filling layer 126, such as in the deposition process as described in FIG. 9, in accordance with some embodiments. A dummy semiconductor die (not shown), which may be placed over a respective integrated circuit die 50A by an additional pick-and-place process, may not be needed. Although not illustrated in FIG. 16, it is appreciated that the liner 108 may be optionally formed in the integrated circuit package 300.

Figure 17:
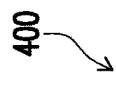
FIGS. 17 to 18 are cross-sectional views of intermediate stages in the manufacturing of an integrated circuit package, in accordance with some embodiments.
Figure 18:
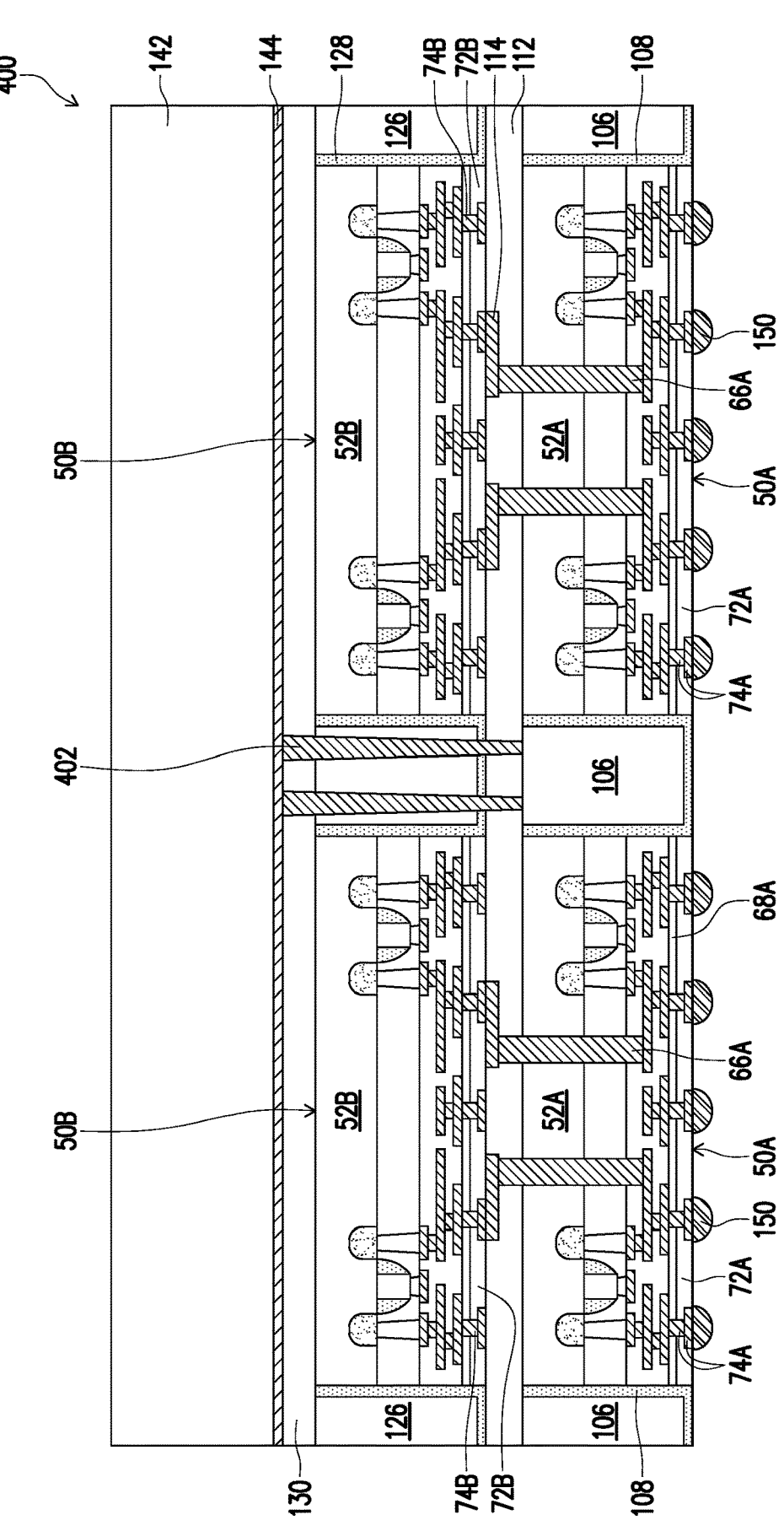

FIGS. 17 to 18 illustrate cross-sectional views of intermediate stages in the manufacturing of an integrated circuit package 400, in accordance with some embodiments. The integrated circuit package 400 may have a structure similar to the integrated circuit package 100 and may be formed using similar processing steps for the integrated circuit package 100, where similar referencing numerals represent similar features. In particular, the processing illustrated in FIG. 17 assumes the processing illustrated in FIGS. 1 to 11 was performed prior. Accordingly, after the processing discussed above with reference to FIGS. 1 to 11, processing may proceed to FIG. 17. In FIG. 17, through vias 402 are formed through at least the bonding film 130, the gap-filling layer 126, the liner 128 (if it exists), and the bonding film 112. In some embodiments, the through vias 402 include a material having a good thermal conductivity, such as copper, a copper alloy, silver, gold, tungsten, cobalt, aluminum, nickel, or the like, a combination thereof, or the like. For example, the through vias 402 may have a similar material as the conductive vias 66A. As such, the through vias 402 may be physically connected to the gap-filling layer 106, thereby improving the heat dissipation efficiency of the gap-filling layer 106. In some embodiments, the through vias 402 are for thermal dissipation purposes and may be electrically isolated from the integrated circuit dies 50A and the integrated circuit dies 50B. Although FIG. 17 illustrates the through vias 402 land on the top surface of the gap-filling layer 106, the through vias 402 may also partially penetrate through the gap-filling layer 106 or completely penetrate through the gap-filling layer 106 (e.g., land on the liner 108). The formation of the through vias 402 may include forming openings in at least the gap-filling layer 126, the liner 128 (if it exists), and the bonding film 112 (or also in the gap-filling layer 106 in some embodiments) by etching, milling, laser techniques, a combination thereof, or the like. The material of the through vias 402 may then be deposited in the openings by electroplating, electroless plating, CVD, ALD, PVD, a combination thereof, or the like. Excess material of the through vias 402 over the bonding film 130 may be removed by a planarization process, such as CMP or grinding. After forming the through vias 402, the processing steps illustrated in FIGS. 12 to 14 are performed, and a resulting structure of the integrated circuit package 400 as illustrated in FIG. 18 is obtained, in accordance with some embodiments.

Figure 19:
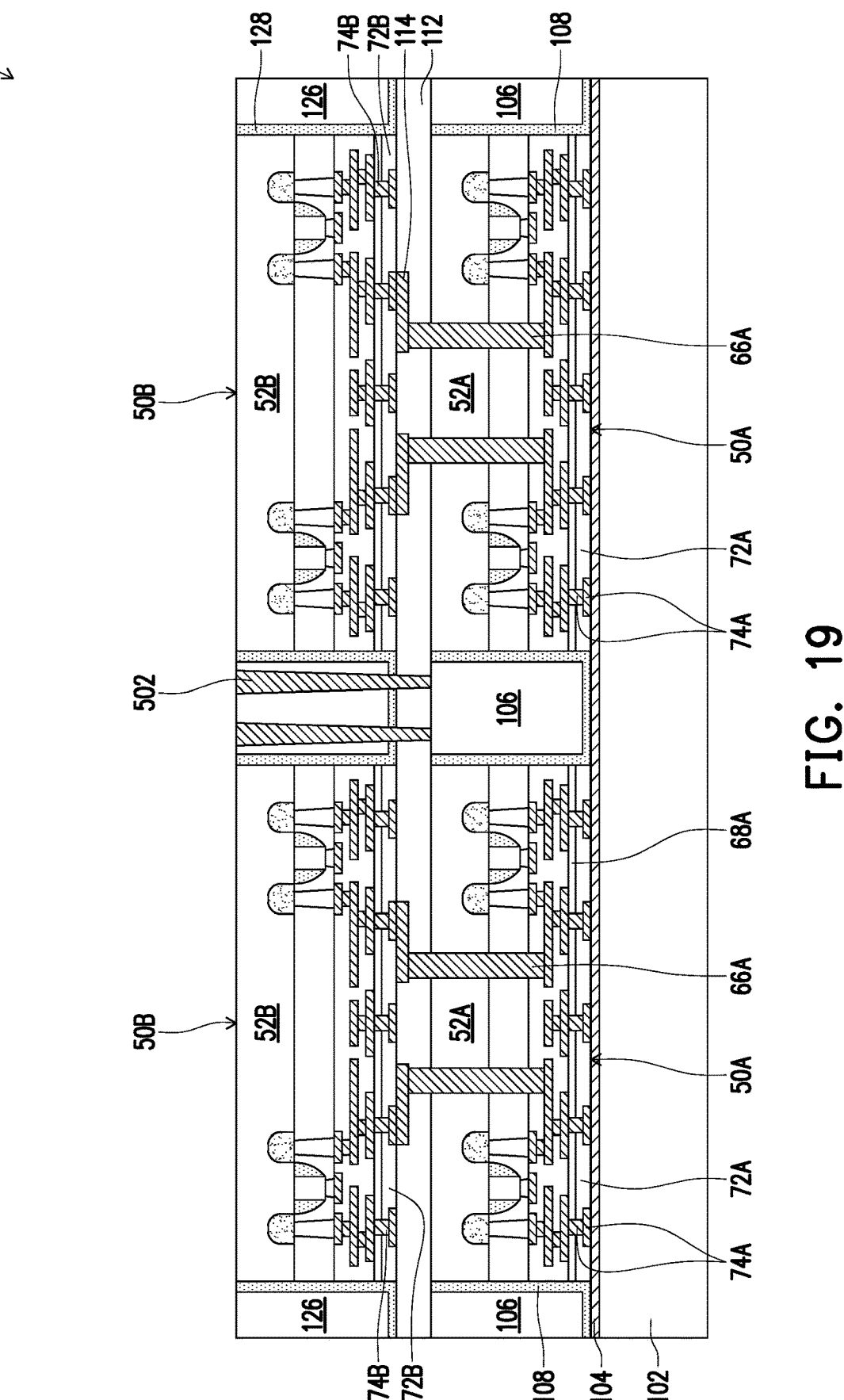
FIGS. 19 to 20 are cross-sectional views of intermediate stages in the manufacturing of an integrated circuit package, in accordance with some embodiments.
Figure 20:
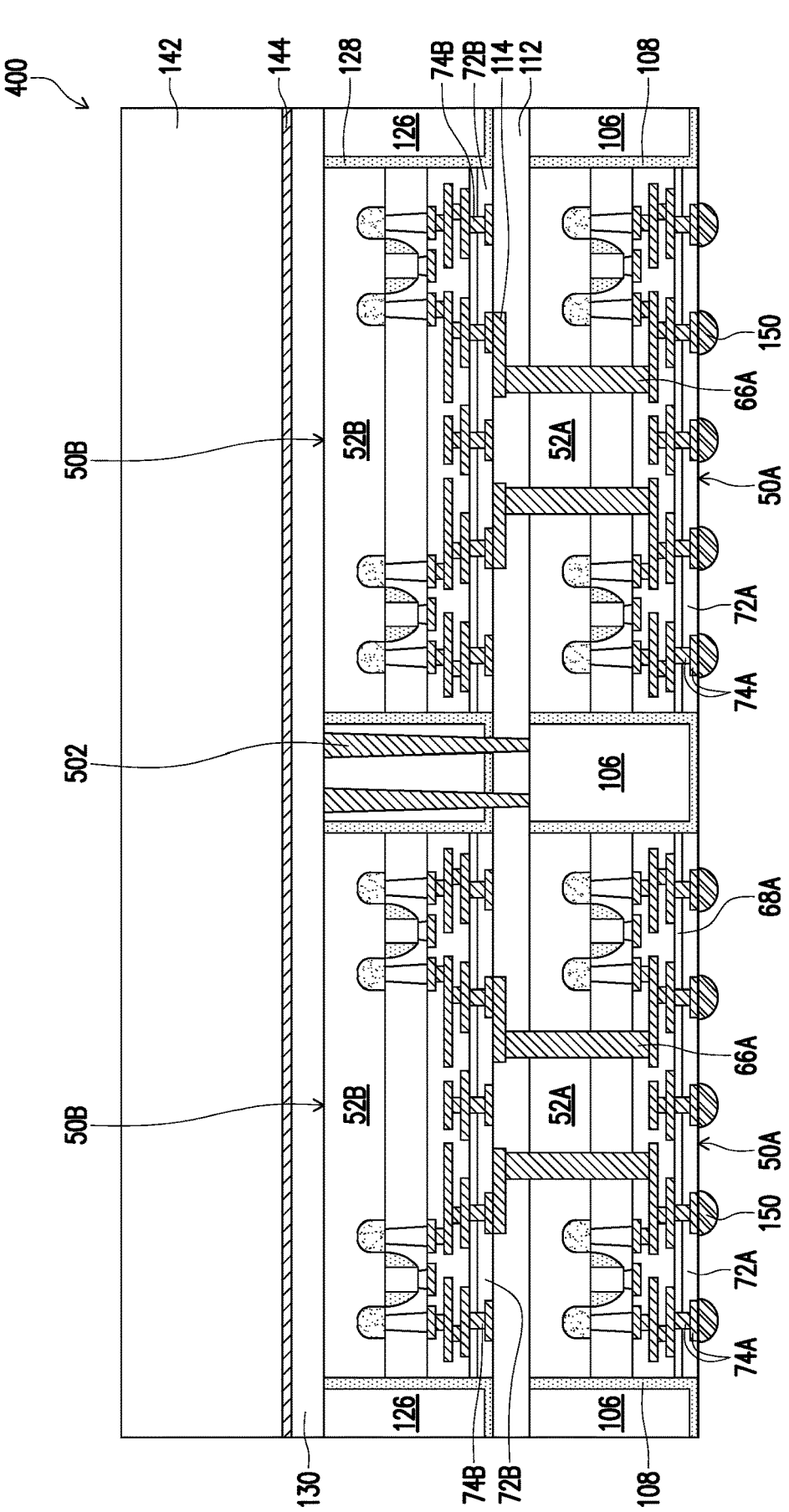

FIGS. 19 to 20 illustrate cross-sectional views of intermediate stages in the manufacturing of an integrated circuit package 500, in accordance with some embodiments. The integrated circuit package 500 may have a structure similar to the integrated circuit package 100 and may be formed using similar processing steps for the integrated circuit package 100, where similar referencing numerals represent similar features. In particular, the processing illustrated in FIG. 19 assumes the processing illustrated in FIGS. 1 to 10 was performed prior. Accordingly, after the processing discussed above with reference to FIGS. 1 to 10, processing may proceed to FIG. 19. In FIG. 19, through vias 502 are formed through at least the gap-filling layer 126, the liner 128 (if it exists), and the bonding film 112. In some embodiments, the through vias 502 include a material having a good thermal conductivity, such as copper, a copper alloy, silver, gold, tungsten, cobalt, aluminum, nickel, or the like, a combination thereof, or the like. For example, the through vias 502 may have a similar material as the conductive vias 66A. As such, the through vias 502 may be physically connected to the gap-filling layer 106, thereby improving the heat dissipation efficiency of the gap-filling layer 106. In some embodiments, the through vias 502 are for thermal dissipation purposes and may be electrically isolated from the integrated circuit dies 50A and the integrated circuit dies 50B. Although FIG. 19 illustrates that the through vias 502 lands on the top surface of the gap-filling layer 106, the through vias 502 may also partially penetrate through the gap-filling layer 106. The formation of the through vias 502 may include forming openings in at least the gap-filling layer 126, the liner 128 (if it exists), and the bonding film 112 (or also in the gap-filling layer 106 in some embodiments) by etching, milling, laser techniques, a combination thereof, or the like. The material of the through vias 502 may then be formed in the openings by electroplating, electroless plating, CVD, ALD, PVD, a combination thereof, or the like. Excess material of the through vias 502, such as over the gap-filling layer 126 or the liner 128, may be removed by a planarization process, such CMP or grinding. In some embodiments, the formation of the through vias 502 is formed before the planarization process applied to the as-deposited gap-filling layer 126 and the liner 128, and the excess material of the through vias 502 is removed together in the planarization process applied to the as-deposited gap-filling layer 126 and the liner 128 (if it exists). In some embodiments, the formation of the through vias 502 is performed after the planarization process is applied to the as-deposited gap-filling layer 126 and the liner 128 (if it exists). After forming the through vias 502, the processing steps illustrated in FIGS. 11 to 14 are performed, and a resulting structure of the integrated circuit package 500 as illustrated in FIG. 20 is obtained, in accordance with some embodiments.

Figure 21:
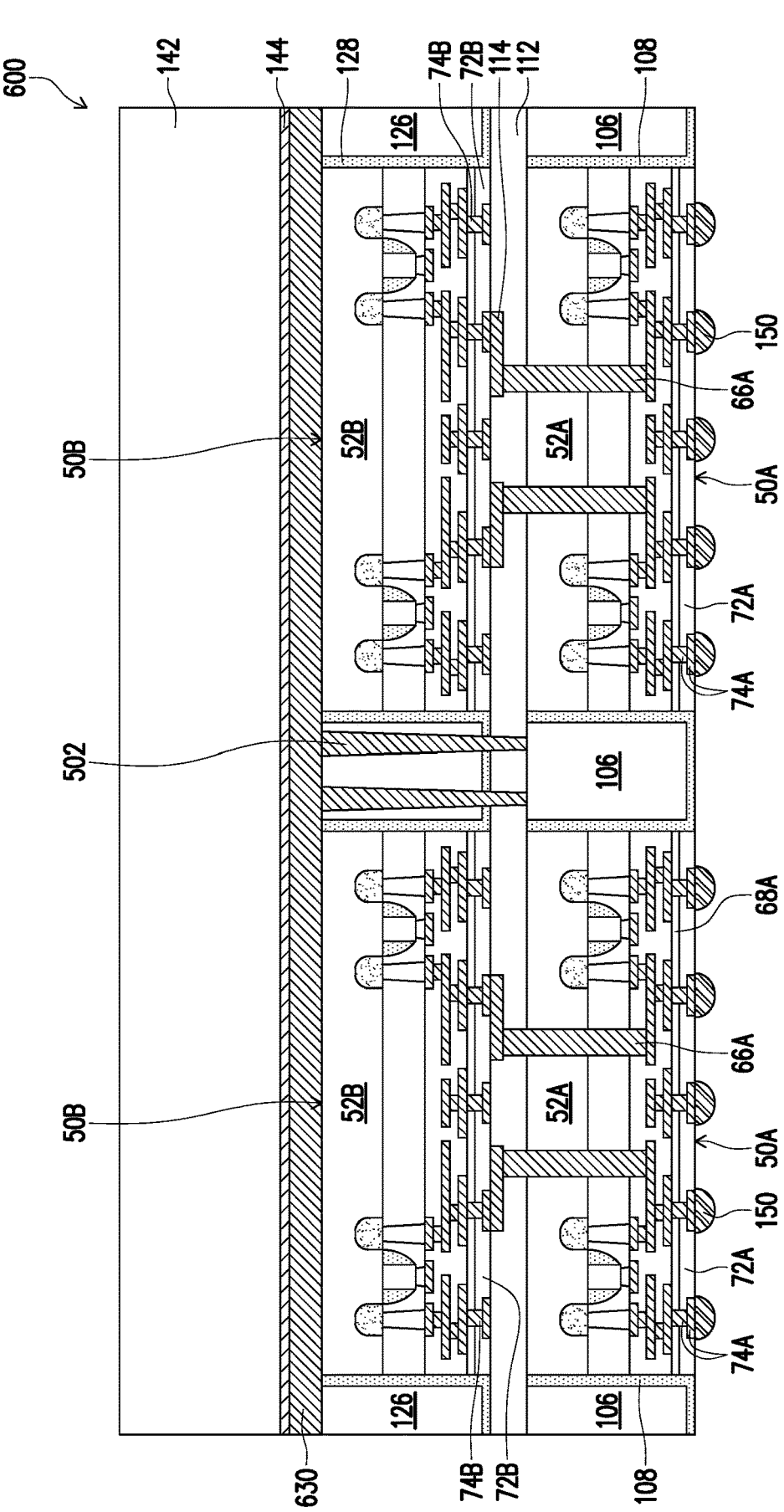
FIG. 21 is a cross-sectional view of an integrated circuit package, in accordance with some embodiments.

FIG. 21 illustrates a cross-sectional view of intermediate stages in the manufacturing of an integrated circuit package 600, in accordance with some embodiments. The integrated circuit package 600 may have a structure similar to the integrated circuit package 100 or 500 (e.g., without or with the through vias 502) and may be formed using similar processing steps for the integrated circuit package 100 or 500, where similar referencing numerals represent similar features. In the integrated circuit package 600, the bonding film 130 as illustrated in the integrated circuit package 100 or 500 may be replaced with a metal film 630 for improving the heat dissipation efficiency for the integrated circuit dies 50A and 50B. The metal film 630 may include copper, a copper alloy, silver, gold, tungsten, cobalt, aluminum, nickel, iron, an alloy thereof, a combination thereof, or the like, and may be formed by electroplating, electroless plating, CVD, PVD, or other suitable methods. In this embodiment, the bonding film 144 may use an adhesive material such as thermal interface material (TIM) or die attach film for attaching the support substrate 142 to the metal film 630.

Figure 22:
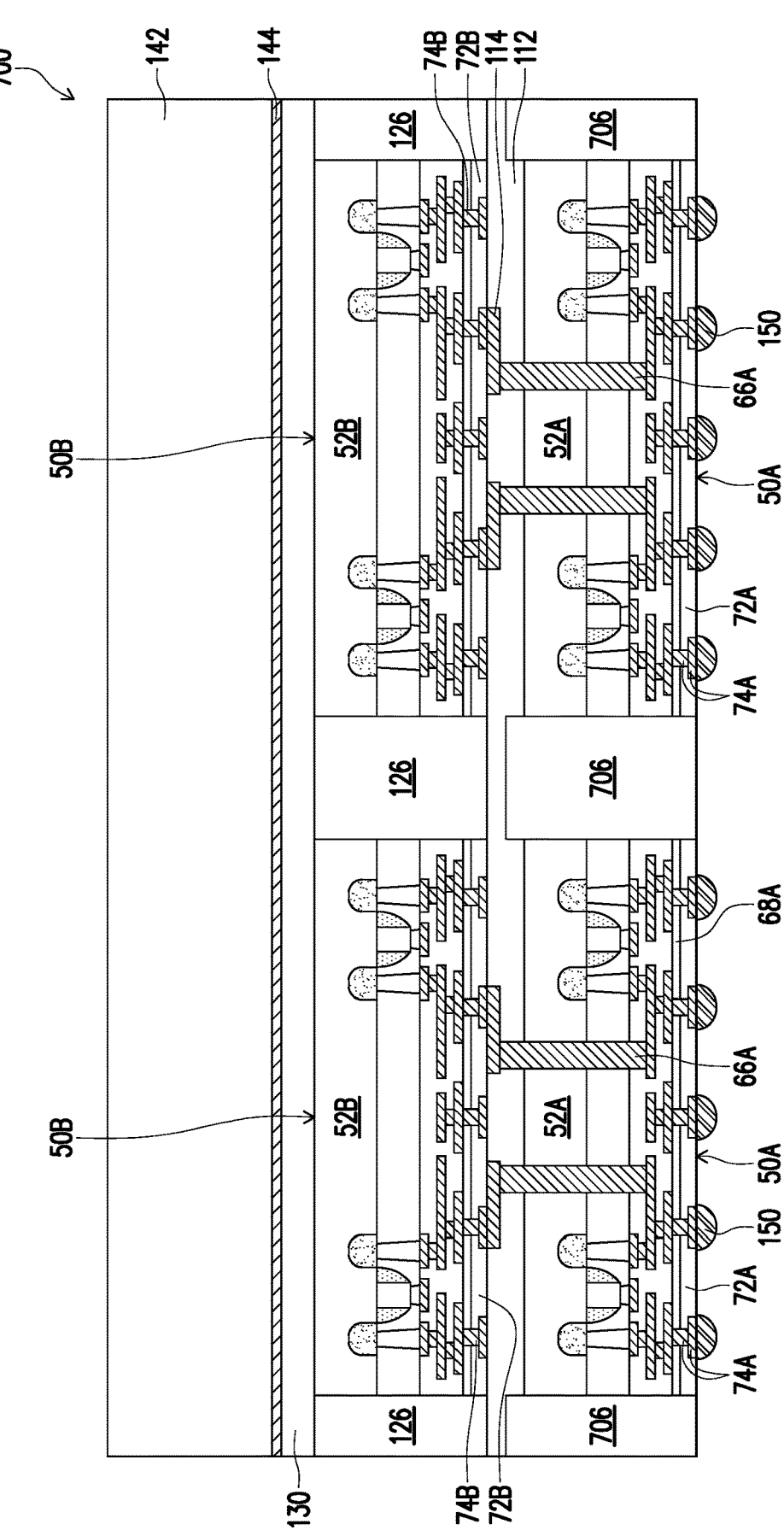
FIGS. 22 and 23 are cross-sectional views of an integrated circuit package, in accordance with some embodiments.

FIG. 22 illustrates a cross-sectional view of intermediate stages in the manufacturing of an integrated circuit package 700, in accordance with some embodiments. The integrated circuit package 700 may have a structure similar to the integrated circuit package 200 and may be formed using similar processing steps for the integrated circuit package 200, where similar referencing numerals represent similar features. In the integrated circuit package 700, the gap-filling layer 706 may have a top surface higher than the back-side surfaces of the integrated circuit dies 50A, resulting in a reduced thickness of the bonding film 112 over the gap-filling layer 706, thereby improving the heat dissipation efficiency between the gap-filling layer 706 to the gap-filling layer 126. In some embodiments, the gap-filling layer 706 and the gap-filling layer 106 have a similar material. In some embodiments, the gap-filling layer 706 may be a material similar to the material of the gap-filling layer 106 and may be formed by similar methods and processing steps as the gap-filling layer 106 as described in FIG. 4.

Figure 23:
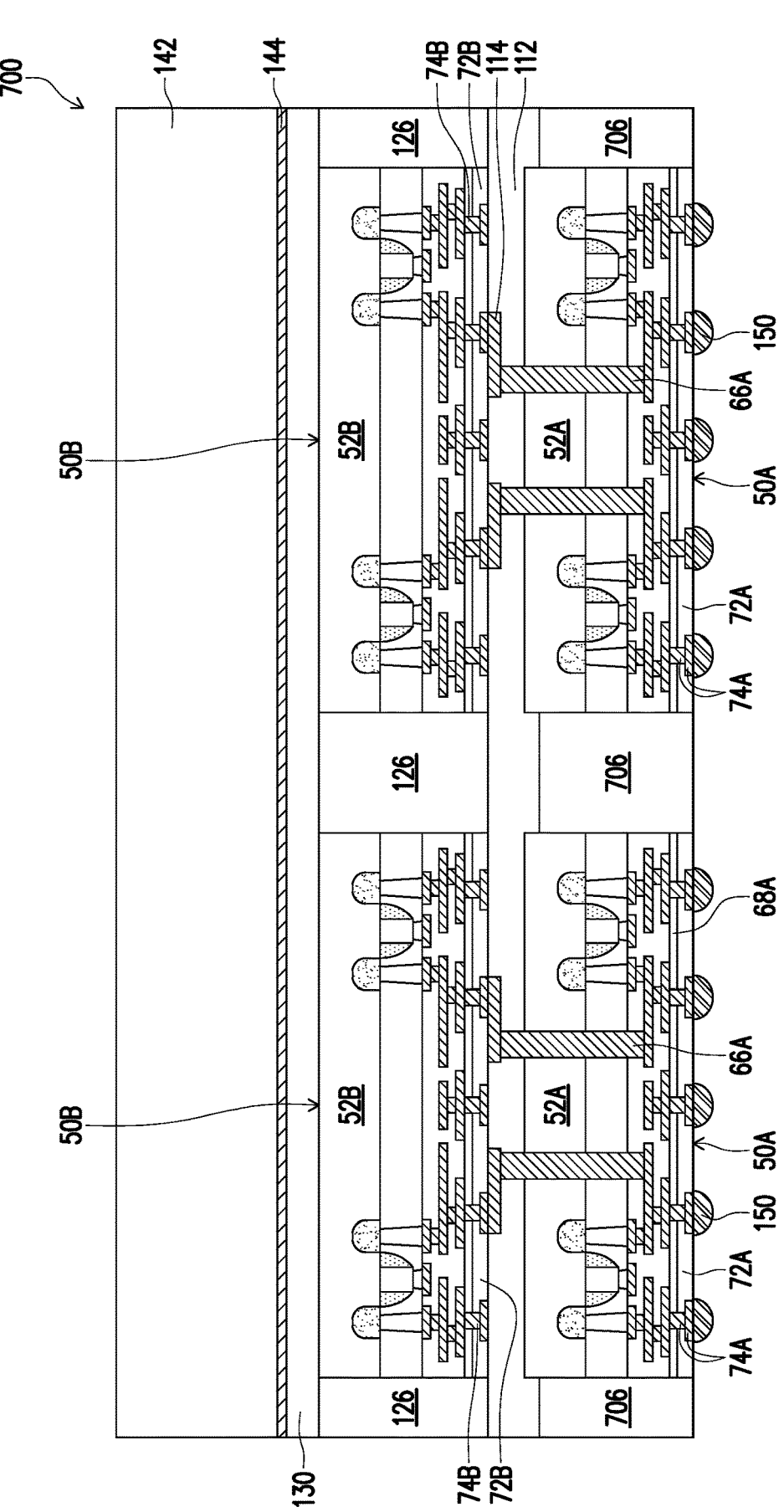

In some embodiments, when performing the recessing process as described in FIG. 5 for exposing the conductive vias 66A, the recessing process may use an etchant that has different etching rates with respect to the gap-filling layer 706 and the semiconductor substrates 52A. For example, in an embodiment that the gap-filling layer 106 is silicon carbide, and the semiconductor substrate 52A is silicon, the etching rate of the gap-filling layer 106 may be lower than the etching rate of the semiconductor substrates 52A. As such, the gap-filling layer 706 may have a top surface higher than the back-side surfaces of the semiconductor substrates 52A after the recessing process as described in FIG. 5 is performed. Next, similar processing steps as described in FIGS. 6 to 14 may be performed, and the resulting structure of the integrated circuit package 700 is illustrated in FIG. 22. It is also appreciated that, referring to FIG. 23, the gap-filling layer 706 may have a top surface lower than the back-side surfaces of the semiconductor substrates 52A when suitable materials of the gap-filling layer 706 (e.g., silicon) and the semiconductor substrates 52A (e.g., silicon carbide) and/or etchants used, in accordance with some embodiments.

Figure 24:
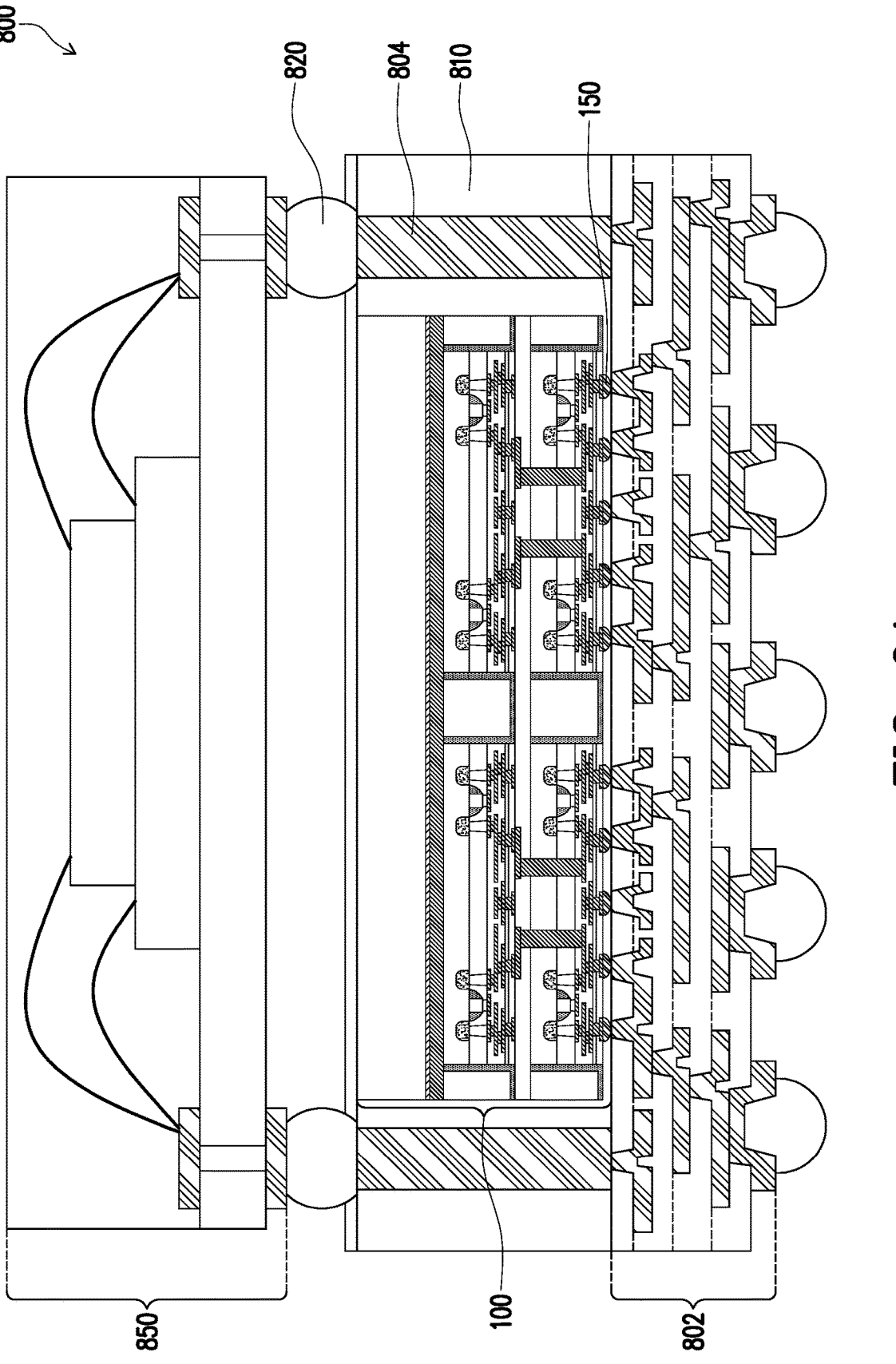
FIG. 24 is a cross-sectional view of an integrated circuit device, in accordance with some embodiments.

In some embodiments, the integrated circuit package 100, 200, 300, 400, 500, 600, or 700 (collectively referred to as integrated circuit package 100 hereafter) is a component that may be subsequently implemented in an integrated circuit device. For example, an integrated circuit device is formed by attaching the integrated circuit package 100 to another component, such as an interposer, a packing substrate, or the like. FIG. 24 illustrates a cross-sectional view of an integrated circuit device 800 implementing the integrated circuit package 100, in accordance with some embodiments. The integrated circuit device 800 may be formed by attaching the conductive connectors 150 of the integrated circuit package 100 to a redistribution structure 802, which may include one or more levels of metallization patterns distributed in dielectric layers. In some embodiments, the integrated circuit device 800 may also optionally include through vias 804 formed over the redistribution structure 802 and laterally surrounding the integrated circuit package 100. The through vias 804 may include a material (e.g., copper or copper alloy) similar to the conductive vias 66A and may be formed by electroplating or other suitable methods. The integrated circuit package 100 and the through vias 804 may be encapsulated, such as laterally surrounded, by an encapsulant 810, for forming a fan-out structure. The encapsulant 810 may include a molding compound, an epoxy-based material, or other suitable materials.

In some embodiments, another integrated circuit package 850 may be disposed over the through vias 804 using conductive connectors 820. The conductive connectors 820 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The integrated circuit package 850 may electrically couple to the integrated circuit package 100 through the conductive connectors 820, the through vias 804, and the redistribution structure 802. The integrated circuit package 850 may include one or more stacked dies 830, such as stacked memory dies such as low-power (LP) double data rate (DDR) memory modules, such as LPDDR1, LPDDR2, LPDDR3, LPDDR4, or the like memory modules.

In some embodiments, an integrated circuit package having improved heat dissipation efficiency is provided. The integrated circuit package may include integrated circuit dies and a gap-filling layer filling a gap between adjacent integrated circuit dies. The gap-filling layer may be formed of a material having high thermal conductivity and low CTE mismatch with the material of semiconductor substrates of the integrated circuit dies. As such, the heat generated by the integrated circuit dies may be effectively dissipated to other components through the gap-filling layer.

In an embodiment, a device includes a first integrated circuit die, wherein the first integrated circuit die includes a substrate formed of a semiconductor material and a conductive via penetrating through the substrate; a second integrated circuit die disposed laterally adjacent to the first integrated circuit die; a first gap-filling layer disposed between the first integrated circuit die and the second integrated circuit die, wherein the first gap-filling layer is formed of a material selected from silicon, silicon carbide, silicon oxynitride, silicon nitride, the semiconductor material of the substrate, or a combination thereof; and a third integrated circuit die attached to the first integrated circuit die in a face-to-back manner. In an embodiment, the first gap-filling layer and the substrate of the first integrated circuit die have a same material with different crystalline structures. In an embodiment, the device further includes a bonding film and a conductive bonding feature, wherein the conductive bonding feature is in the bonding film over the conductive via wherein the bonding film extends over the first integrated circuit die, the second integrated circuit die, and the first gap-filling layer and laterally surrounds a portion of the conductive via. In an embodiment, the third integrated circuit die includes a dielectric layer and a die connector in the dielectric layer, wherein the dielectric layer is bonded to the bonding film through a dielectric-to-dielectric bond, and the die connector is bonded to the conductive bonding feature through a metal-to-metal bond. In an embodiment, the device further includes a second gap-filling layer disposed over the first gap-filling layer, wherein the second gap-filling layer is formed of a material selected from silicon, silicon carbide, silicon oxynitride, silicon nitride, the material of the first gap-filling layer, or a combination thereof. In an embodiment, the second gap-filling layer extends over the second integrated circuit die and laterally surrounds the third integrated circuit die. In an embodiment, the device further includes a through via penetrating through the second gap-filling layer, wherein the through via is electrically isolated from the first integrated circuit die, the second integrated circuit die, and the third integrated circuit die.

In an embodiment, a device includes a first tier, including first integrated circuit dies and a first gap-filling layer disposed in a first gap between the first integrated circuit dies, wherein the first integrated circuit dies respectively include a substrate formed of a semiconductor material, wherein the first gap-filling layer is formed of a material has a thermal conductivity higher than 2 W/m·K and a coefficient of thermal expansion mismatch less than 1.3 μm/(m·K) with the semiconductor material; a second tier disposed over the first tier, wherein the second tier includes second integrated circuit dies and a second gap-filling layer disposed in a second gap between the second integrated circuit dies, wherein at least one of the second integrated circuit dies is bonded to a respective one of the first integrated circuit dies in a face-to-back manner; and a support substrate disposed over the second integrated circuit dies and the second gap-filling layer. In an embodiment, the second gap-filling layer includes a top surface level with respective surfaces of the second integrated circuit dies, and on an opposite side of the respective second integrated circuit dies relative to the first integrated circuit dies. In an embodiment, the first gap-filling layer includes a top surface higher than respective surfaces of the first integrated circuit dies, which are facing the second integrated circuit dies. In an embodiment, the first gap-filling layer includes a top surface lower than respective surfaces of the first integrated circuit dies, which are facing the second integrated circuit dies. In an embodiment, the device further includes a through via penetrating the second gap-filling layer, wherein the through via is electrically isolated from the second integrated circuit dies. In an embodiment, the device further includes a dielectric liner disposed between the second gap-filling layer, the second integrated circuit dies, and the first gap-filling layer, wherein the through via penetrates through the dielectric liner. In an embodiment, the device further includes a metal film disposed between the support substrate and the second integrated circuit dies and between the support substrate and the second gap-filling layer, wherein the through via is in physical contact with the metal film.

In an embodiment, a method including disposing a first integrated circuit die and a second integrated circuit die over a carrier substrate, wherein the first integrated circuit die includes a substrate formed of a semiconductor material;

forming a first gap-filling layer in a gap between the first integrated circuit die and the second integrated circuit die, wherein the first gap-filling layer is formed of a material selected from silicon, silicon carbide, silicon oxynitride, silicon nitride, the semiconductor material of the substrate, or a combination thereof; and attaching a third integrated circuit die to the first integrated circuit die in a face-to-back manner. In an embodiment, the method further includes forming a second gap-filling layer over the first gap-filling layer and laterally adjacent to the third integrated circuit die. In an embodiment, the method further includes forming a through via penetrating through the second gap-filling layer. In an embodiment, the first integrated circuit die includes a conductive via in the substrate when being disposed over the carrier substrate, wherein the method further includes performing a recessing process to recess the substrate and expose the conductive via before attaching the third integrated circuit die to the first integrated circuit die. In an embodiment, the recess process includes recessing the first gap-filling layer. In an embodiment, the method further includes forming a bonding film laterally around a portion of the conductive via and over the first gap-filling layer, wherein the third integrated circuit die includes a dielectric layer bonded to the bonding film through dielectric-to-dielectric bonds.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first integrated circuit die, wherein the first integrated circuit die comprises a substrate formed of a semiconductor material and a conductive via penetrating through the substrate;
a second integrated circuit die disposed laterally adjacent to the first integrated circuit die;
a first gap-filling layer disposed between the first integrated circuit die and the second integrated circuit die, wherein the first gap-filling layer and the substrate of the first integrated circuit die comprise a same material and have different crystalline structures; and
a third integrated circuit die attached to the first integrated circuit die in a face-to-back manner.

2. The device of claim 1, further comprising a bonding film and a conductive bonding feature, wherein the conductive bonding feature is in the bonding film over the conductive via wherein the bonding film extends over the first integrated circuit die, the second integrated circuit die, and the first gap-filling layer and laterally surrounds a portion of the conductive via.

3. The device of claim 2, wherein the third integrated circuit die comprises a dielectric layer and a die connector in the dielectric layer, wherein the dielectric layer is bonded to the bonding film through a dielectric-to-dielectric bond, and the die connector is bonded to the conductive bonding feature through a metal-to-metal bond.

4. The device of claim 1, further comprising a second gap-filling layer disposed over the first gap-filling layer, wherein the second gap-filling layer is formed of a material selected from silicon, silicon carbide, silicon oxynitride, silicon nitride, the material of the first gap-filling layer, or a combination thereof.

5. The device of claim 4, wherein the second gap-filling layer extends over the second integrated circuit die and laterally surrounds the third integrated circuit die.

6. The device of claim 4, further comprising a through via penetrating through the second gap-filling layer, wherein the through via is electrically isolated from the first integrated circuit die, the second integrated circuit die, and the third integrated circuit die.

7. The device of claim 1, further comprising a bonding film overlying the third integrated circuit die.

8. The device of claim 7, wherein the bonding film is a metal.

9. The device of claim 1, further comprising a second gap-filling film adjacent to the third integrated circuit die, and a conductive via extending through the second gap-filling film.

10. A device comprising:
a first tier, comprising first integrated circuit dies and a first gap-filling layer disposed in a first gap between the first integrated circuit dies, wherein the first integrated circuit dies respectively comprise a substrate formed of a semiconductor material, wherein the first gap-filling layer is formed of a material having a thermal conductivity higher than 2 W/m·K and a coefficient of thermal expansion mismatch less than 1.3 μm/(m·K) with the semiconductor material;
a second tier disposed over the first tier, wherein the second tier comprises at least one second integrated circuit die and a second gap-filling layer disposed adjacent the at least one second integrated circuit die, wherein the at least one second integrated circuit die is bonded to one of the first integrated circuit dies in a face-to-back manner; and
a support substrate disposed over the at least one second integrated circuit die and the second gap-filling layer.

11. The device of claim 10, wherein the second gap-filling layer comprises a top surface level with a surface of the at least one second integrated circuit die, and on an opposite side of the second integrated circuit die relative to the first integrated circuit dies.

12. The device of claim 11, wherein the first gap-filling layer comprises a top surface higher than or lower than respective surfaces of the first integrated circuit dies, which are facing the at least one second integrated circuit die.

13. The device of claim 10, further comprising a through via penetrating the second gap-filling layer, wherein the through via is electrically isolated from the at least one second integrated circuit die.

14. The device of claim 13, further comprising a dielectric liner disposed between the second gap-filling layer, the at least one second integrated circuit die, and the first gap-filling layer, wherein the through via penetrates through the dielectric liner.

15. The device of claim 13, further comprising a metal film disposed between the support substrate and the at least one second integrated circuit die and between the support substrate and the second gap-filling layer, wherein the through via is in physical contact with the metal film.

16. A method comprising:
disposing a first integrated circuit die and a second integrated circuit die over a carrier substrate, wherein the first integrated circuit die comprises a substrate formed of a semiconductor material;
forming a first gap-filling layer in a gap between the first integrated circuit die and the second integrated circuit die, wherein the first gap-filling layer comprises the semiconductor material of the substrate;
attaching a third integrated circuit die to the first integrated circuit die in a face-to-back manner;
forming a second gap-filling layer over the first gap-filling layer and laterally adjacent to the third integrated circuit die; and
forming a through via penetrating through the second gap-filling layer.

17. The method of claim 16, wherein the first integrated circuit die comprises a conductive via in the substrate when being disposed over the carrier substrate, wherein the method further comprises performing a recessing process to recess the substrate and expose the conductive via before attaching the third integrated circuit die to the first integrated circuit die.

18. The method of claim 17, wherein the recessing process comprises recessing the first gap-filling layer.

19. The method of claim 18, further comprising forming a bonding film laterally around a portion of the conductive via and over the first gap-filling layer, wherein the third integrated circuit die comprises a dielectric layer bonded to the bonding film through dielectric-to-dielectric bonds.

* * * * *